(12) United States Patent
Raring et al.

(10) Patent No.: US 8,451,876 B1
(45) Date of Patent: May 28, 2013

(54) METHOD AND SYSTEM FOR PROVIDING BIDIRECTIONAL LIGHT SOURCES WITH BROAD SPECTRUM

(75) Inventors: James W. Raring, Fremont, CA (US); Mathew C. Schmidt, Fremont, CA (US); Yu-Chia Chang, Fremont, CA (US)

(73) Assignee: SORAA, Inc., Fremont, CA (US)

( * ) Notice: Subject to any disclaimer, the term of this patent is extended or adjusted under 35 U.S.C. 154(b) by 0 days.

(21) Appl. No.: 13/108,645

(22) Filed: May 16, 2011

Related U.S. Application Data

(60) Provisional application No. 61/345,561, filed on May 17, 2010.

(51) Int. Cl.
*H01S 5/00* (2006.01)

(52) U.S. Cl.
USPC ............... 372/45.01; 372/43.01; 372/46.01; 372/49.01

(58) Field of Classification Search
USPC .................... 372/43.01, 45.01, 46.01
See application file for complete search history.

(56) References Cited

U.S. PATENT DOCUMENTS

| | | | |
|---|---|---|---|
| 4,341,592 A | 7/1982 | Shortes et al. | |
| 4,860,687 A | 8/1989 | Frijlink | |
| 4,911,102 A | 3/1990 | Manabe et al. | |
| 5,331,654 A | 7/1994 | Jewell et al. | |
| 5,334,277 A | 8/1994 | Nakamura | |
| 5,366,953 A | 11/1994 | Char et al. | |
| 5,527,417 A | 6/1996 | Lida et al. | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,696,389 A | 12/1997 | Ishikawa et al. | |
| 5,821,555 A | 10/1998 | Saito et al. | |
| 5,888,907 A | 3/1999 | Tomoyasu et al. | |
| 5,926,493 A | 7/1999 | O'Brien et al. | |
| 5,951,923 A | 9/1999 | Horie et al. | |
| 6,069,394 A | 5/2000 | Hashimoto et al. | |
| 6,147,953 A | 11/2000 | Duncan | |
| 6,153,010 A | 11/2000 | Kiyoku et al. | |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.

(Continued)

*Primary Examiner* — Dung Nguyen

(74) *Attorney, Agent, or Firm* — Kilpatrick Townsend & Stockton LLP

(57) ABSTRACT

A system and method for providing laser diodes with broad spectrum is described. GaN-based laser diodes with broad or multi-peaked spectral output operating are obtained in various configurations by having a single laser diode device generating multiple-peak spectral outputs, operate in superluminescene mode, or by use of an RF source and/or a feedback signal. In some other embodiments, multi-peak outputs are achieved by having multiple laser devices output different lasers at different wavelengths.

13 Claims, 15 Drawing Sheets

U.S. PATENT DOCUMENTS

| | | | |
|---|---|---|---|
| 6,195,381 B1 * | 2/2001 | Botez et al. | 372/96 |
| 6,379,985 B1 | 4/2002 | Cervantes et al. | |
| 6,451,157 B1 | 9/2002 | Hubacek | |
| 6,586,762 B2 | 7/2003 | Kozaki | |
| 6,635,904 B2 | 10/2003 | Goetz et al. | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,809,781 B2 | 10/2004 | Setlur et al. | |
| 6,814,811 B2 | 11/2004 | Ose | |
| 6,833,564 B2 | 12/2004 | Shen et al. | |
| 6,858,081 B2 | 2/2005 | Biwa et al. | |
| 6,920,166 B2 | 7/2005 | Akasaka et al. | |
| 7,009,199 B2 | 3/2006 | Hall | |
| 7,019,325 B2 * | 3/2006 | Li et al. | 257/14 |
| 7,033,858 B2 | 4/2006 | Chai et al. | |
| 7,053,413 B2 | 5/2006 | D'Evelyn et al. | |
| 7,063,741 B2 | 6/2006 | D'Evelyn | |
| 7,128,849 B2 | 10/2006 | Setlur et al. | |
| 7,220,324 B2 | 5/2007 | Baker et al. | |
| 7,303,630 B2 | 12/2007 | Motoki et al. | |
| 7,312,156 B2 | 12/2007 | Granneman et al. | |
| 7,323,723 B2 | 1/2008 | Ohtsuka et al. | |
| 7,338,828 B2 | 3/2008 | Imer et al. | |
| 7,358,542 B2 | 4/2008 | Radkov et al. | |
| 7,358,543 B2 | 4/2008 | Chua et al. | |
| 7,390,359 B2 | 6/2008 | Miyanaga et al. | |
| 7,470,555 B2 | 12/2008 | Matsumura | |
| 7,483,466 B2 | 1/2009 | Uchida et al. | |
| 7,489,441 B2 | 2/2009 | Scheible et al. | |
| 7,555,025 B2 | 6/2009 | Yoshida | |
| 7,691,658 B2 | 4/2010 | Kaeding et al. | |
| 7,709,284 B2 | 5/2010 | Iza et al. | |
| 7,727,332 B2 | 6/2010 | Habel et al. | |
| 7,733,571 B1 | 6/2010 | Li | |
| 7,749,326 B2 | 7/2010 | Kim et al. | |
| 7,806,078 B2 | 10/2010 | Yoshida | |
| 7,858,408 B2 | 12/2010 | Mueller et al. | |
| 7,862,761 B2 | 1/2011 | Okushima et al. | |
| 7,923,741 B1 | 4/2011 | Zhai et al. | |
| 7,939,354 B2 | 5/2011 | Kyono et al. | |
| 7,968,864 B2 | 6/2011 | Akita et al. | |
| 8,017,932 B2 | 9/2011 | Okamoto et al. | |
| 8,044,412 B2 | 10/2011 | Murphy et al. | |
| 8,124,996 B2 | 2/2012 | Raring et al. | |
| 8,126,024 B1 | 2/2012 | Raring | |
| 8,143,148 B1 | 3/2012 | Raring et al. | |
| 8,242,522 B1 | 8/2012 | Raring | |
| 8,247,887 B1 | 8/2012 | Raring et al. | |
| 8,252,662 B1 | 8/2012 | Poblenz et al. | |
| 8,254,425 B1 | 8/2012 | Raring | |
| 8,259,769 B1 | 9/2012 | Raring et al. | |
| 8,294,179 B1 | 10/2012 | Raring | |
| 8,314,429 B1 | 11/2012 | Raring et al. | |
| 2002/0050488 A1 | 5/2002 | Nikitin et al. | |
| 2002/0085603 A1 | 7/2002 | Okumura | |
| 2002/0171092 A1 | 11/2002 | Goetz et al. | |
| 2003/0000453 A1 | 1/2003 | Unno et al. | |
| 2003/0001238 A1 | 1/2003 | Ban | |
| 2003/0012243 A1 | 1/2003 | Okumura | |
| 2003/0020087 A1 | 1/2003 | Goto et al. | |
| 2003/0140846 A1 | 7/2003 | Biwa et al. | |
| 2003/0200931 A1 | 10/2003 | Goodwin | |
| 2003/0216011 A1 | 11/2003 | Nakamura et al. | |
| 2004/0025787 A1 | 2/2004 | Selbrede et al. | |
| 2004/0060518 A1 | 4/2004 | Nakamura et al. | |
| 2004/0099213 A1 | 5/2004 | Adomaitis et al. | |
| 2004/0146264 A1 | 7/2004 | Auner et al. | |
| 2004/0151222 A1 | 8/2004 | Sekine | |
| 2004/0196877 A1 | 10/2004 | Kawakami et al. | |
| 2004/0233950 A1 | 11/2004 | Furukawa et al. | |
| 2004/0247275 A1 | 12/2004 | Vakhshoori et al. | |
| 2005/0040384 A1 | 2/2005 | Tanaka et al. | |
| 2005/0072986 A1 | 4/2005 | Sasaoka | |
| 2005/0168564 A1 | 8/2005 | Kawaguchi et al. | |
| 2005/0214992 A1 | 9/2005 | Chakraborty et al. | |
| 2005/0224826 A1 | 10/2005 | Keuper et al. | |
| 2005/0229855 A1 | 10/2005 | Raaijmakers | |
| 2005/0247260 A1 | 11/2005 | Shin et al. | |
| 2005/0285128 A1 | 12/2005 | Scherer et al. | |
| 2006/0033009 A1 | 2/2006 | Kobayashi et al. | |
| 2006/0037529 A1 | 2/2006 | D'Evelyn | |
| 2006/0060131 A1 | 3/2006 | Atanackovic | |
| 2006/0078022 A1 | 4/2006 | Kozaki et al. | |
| 2006/0079082 A1 | 4/2006 | Bruhns et al. | |
| 2006/0086319 A1 | 4/2006 | Kasai et al. | |
| 2006/0118799 A1 | 6/2006 | D'Evelyn et al. | |
| 2006/0126688 A1 | 6/2006 | Kneissl | |
| 2006/0144334 A1 | 7/2006 | Yim et al. | |
| 2006/0175624 A1 | 8/2006 | Sharma et al. | |
| 2006/0189098 A1 | 8/2006 | Edmond | |
| 2006/0193359 A1 | 8/2006 | Kuramoto | |
| 2006/0216416 A1 | 9/2006 | Sumakeris et al. | |
| 2006/0256482 A1 | 11/2006 | Araki et al. | |
| 2006/0288928 A1 | 12/2006 | Eom et al. | |
| 2007/0081857 A1 | 4/2007 | Yoon | |
| 2007/0086916 A1 | 4/2007 | LeBoeuf et al. | |
| 2007/0093073 A1 | 4/2007 | Farrell et al. | |
| 2007/0101932 A1 | 5/2007 | Schowalter et al. | |
| 2007/0110112 A1 | 5/2007 | Sugiura | |
| 2007/0120141 A1 | 5/2007 | Moustakas et al. | |
| 2007/0153866 A1 | 7/2007 | Shchegrov et al. | |
| 2007/0163490 A1 | 7/2007 | Habel et al. | |
| 2007/0184637 A1 | 8/2007 | Haskell et al. | |
| 2007/0217462 A1 | 9/2007 | Yamasaki | |
| 2007/0242716 A1 | 10/2007 | Samal et al. | |
| 2007/0259464 A1 | 11/2007 | Bour et al. | |
| 2007/0272933 A1 | 11/2007 | Kim et al. | |
| 2007/0280320 A1 | 12/2007 | Feezell et al. | |
| 2008/0087919 A1 | 4/2008 | Tysoe et al. | |
| 2008/0092812 A1 | 4/2008 | McDiarmid et al. | |
| 2008/0095492 A1 | 4/2008 | Son et al. | |
| 2008/0121916 A1 | 5/2008 | Teng et al. | |
| 2008/0124817 A1 | 5/2008 | Bour et al. | |
| 2008/0149949 A1 | 6/2008 | Nakamura et al. | |
| 2008/0149959 A1 | 6/2008 | Nakamura et al. | |
| 2008/0164578 A1 | 7/2008 | Tanikella et al. | |
| 2008/0173735 A1 | 7/2008 | Mitrovic et al. | |
| 2008/0191192 A1 | 8/2008 | Feezle et al. | |
| 2008/0191223 A1 | 8/2008 | Nakamura et al. | |
| 2008/0198881 A1 | 8/2008 | Farrell et al. | |
| 2008/0217745 A1 | 9/2008 | Miyanaga et al. | |
| 2008/0232416 A1 | 9/2008 | Okamoto et al. | |
| 2008/0251020 A1 | 10/2008 | Franken et al. | |
| 2008/0285609 A1 | 11/2008 | Ohta et al. | |
| 2008/0291961 A1 | 11/2008 | Kamikawa et al. | |
| 2008/0303033 A1 | 12/2008 | Brandes | |
| 2008/0308815 A1 | 12/2008 | Kasai et al. | |
| 2008/0315179 A1 | 12/2008 | Kim et al. | |
| 2009/0021723 A1 | 1/2009 | De Lega | |
| 2009/0058532 A1 | 3/2009 | Kikkawa et al. | |
| 2009/0066241 A1 | 3/2009 | Yokoyama | |
| 2009/0078944 A1 | 3/2009 | Kubota et al. | |
| 2009/0080857 A1 | 3/2009 | St. John-Larkin | |
| 2009/0081857 A1 | 3/2009 | Hanser et al. | |
| 2009/0141765 A1 | 6/2009 | Kohda et al. | |
| 2009/0153752 A1 | 6/2009 | Silverstein | |
| 2009/0159869 A1 | 6/2009 | Ponce et al. | |
| 2009/0229519 A1 | 9/2009 | Saitoh | |
| 2009/0250686 A1 | 10/2009 | Sato et al. | |
| 2009/0267100 A1 | 10/2009 | Miyake et al. | |
| 2009/0273005 A1 | 11/2009 | Lin | |
| 2009/0301387 A1 | 12/2009 | D'Evelyn | |
| 2009/0301388 A1 | 12/2009 | D'Evelyn | |
| 2009/0309110 A1 | 12/2009 | Raring et al. | |
| 2009/0309127 A1 | 12/2009 | Raring et al. | |
| 2009/0316116 A1 | 12/2009 | Melville et al. | |
| 2009/0320744 A1 | 12/2009 | D'Evelyn | |
| 2009/0321778 A1 | 12/2009 | Chen et al. | |
| 2010/0001300 A1 | 1/2010 | Raring et al. | |
| 2010/0003492 A1 | 1/2010 | D'Evelyn | |
| 2010/0006546 A1 | 1/2010 | Young et al. | |
| 2010/0006873 A1 | 1/2010 | Raring et al. | |
| 2010/0025656 A1 | 2/2010 | Raring et al. | |
| 2010/0031875 A1 | 2/2010 | D'Evelyn | |
| 2010/0044718 A1 | 2/2010 | Hanser et al. | |
| 2010/0096615 A1 | 4/2010 | Okamoto et al. | |

| | | | |
|---|---|---|---|
| 2010/0104495 | A1 | 4/2010 | Kawabata et al. |
| 2010/0140745 | A1 | 6/2010 | Khan et al. |
| 2010/0151194 | A1 | 6/2010 | D'Evelyn |
| 2010/0195687 | A1 | 8/2010 | Okamoto et al. |
| 2010/0220262 | A1 | 9/2010 | DeMille et al. |
| 2010/0295054 | A1 | 11/2010 | Okamoto et al. |
| 2010/0302464 | A1 | 12/2010 | Raring |
| 2010/0309943 | A1 | 12/2010 | Chakraborty et al. |
| 2010/0316075 | A1 | 12/2010 | Raring et al. |
| 2010/0327291 | A1 | 12/2010 | Preble et al. |
| 2011/0056429 | A1 | 3/2011 | Raring et al. |
| 2011/0057167 | A1 | 3/2011 | Ueno et al. |
| 2011/0064100 | A1 | 3/2011 | Raring et al. |
| 2011/0064101 | A1 | 3/2011 | Raring et al. |
| 2011/0064102 | A1 | 3/2011 | Raring et al. |
| 2011/0075694 | A1 | 3/2011 | Yoshizumi et al. |
| 2011/0103418 | A1 | 5/2011 | Hardy et al. |
| 2011/0129669 | A1 | 6/2011 | Fujito et al. |
| 2011/0164637 | A1 | 7/2011 | Yoshizumi et al. |
| 2011/0180781 | A1 | 7/2011 | Raring et al. |
| 2011/0182056 | A1 | 7/2011 | Trottier et al. |
| 2011/0186874 | A1 | 8/2011 | Shum |
| 2011/0186887 | A1 | 8/2011 | Trottier et al. |
| 2011/0188530 | A1* | 8/2011 | Lell et al. ............... 372/49.01 |
| 2011/0216795 | A1 | 9/2011 | Hsu et al. |
| 2011/0247556 | A1 | 10/2011 | Raring et al. |
| 2011/0286484 | A1 | 11/2011 | Raring et al. |
| 2012/0104359 | A1 | 5/2012 | Felker et al. |
| 2012/0178198 | A1 | 7/2012 | Raring et al. |
| 2012/0187371 | A1 | 7/2012 | Raring et al. |
| 2012/0314398 | A1 | 12/2012 | Raring et al. |

FOREIGN PATENT DOCUMENTS

| | | |
|---|---|---|
| CN | 1702836 | 11/2005 |
| CN | 101079463 | 11/2007 |
| CN | 101099245 | 1/2008 |
| CN | 101171692 | 4/2008 |
| JP | 3-287770 | 12/1991 |
| JP | 2007-173467 A | 7/2007 |
| JP | 2007-068398 | 4/2008 |
| WO | WO2008-041521 | 4/2008 |

OTHER PUBLICATIONS

Office Action for U.S. Appl. No. 12/481,543 dated Jun. 27, 2011.
Office Action for U.S. Appl. No. 12/482,440 dated Feb. 23, 2011.
Office Action for U.S. Appl. No. 12/482,440 dated Aug. 12, 2011.
Office Action for U.S. Appl. No. 12/484,924 dated Apr. 14, 2011.
Office Action for U.S. Appl. No. 12/491,169 dated Oct. 22, 2010.
Office Action for U.S. Appl. No. 12/491,169 dated May 11, 2011.
Notice of Allowance for U.S. Appl. No. 12/497,289 dated May 22, 2012.
Office Action for U.S. Appl. No. 12/502,058 dated Dec. 8, 2010.
Office Action for U.S. Appl. No. 12/502,058 dated Aug. 19, 2011.
Notice of Allowance for U.S. Appl. No. 12/502,058 dated Apr. 16, 2012.
Office Action for U.S. Appl. No. 12/534,829 dated Apr. 19, 2011.
Notice of Allowance for U.S. Appl. No. 12/534,829 dated Oct. 28, 2011.
Notice of Allowance for U.S. Appl. No. 12/534,829 dated Dec. 5, 2011.
Notice of Allowance for U.S. Appl. No. 12/534,829 dated Dec. 21, 2011.
Office Action for U.S. Appl. No. 12/573,820 dated Mar. 2, 2011.
Office Action for U.S. Appl. No. 12/573,820 dated Oct. 11, 2011.
Office Action for U.S. Appl. No. 12/749,466 dated Jun. 29, 2011.
Office Action for U.S. Appl. No. 12/749,476 dated Apr. 11, 2011.
Office Action for U.S. Appl. No. 12/749,476 dated Nov. 8, 2011.
Notice of Allowance for U.S. Appl. No. 12/749,476 dated May 4, 2012.
Notice of Alloance for U.S. Appl. No. 12/762,269 dated Apr. 23, 2012.
Office Action for U.S. Appl. No. 12/762,271 dated Jun. 6, 2012.
Notice of Allowance for U.S. Appl. No. 12/778,718 dated Apr. 3, 2012.
Notice of Allowance for U.S. Appl. No. 12/778,718 dated Jun. 13, 2012.
Office Action for U.S. Appl. No. 12/868,441 dated Apr. 30, 2012.
Office Action for U.S. Appl. No. 12/880,803 dated Feb. 22, 2012.
Office Action for U.S. Appl. No. 12/883,093 dated Mar. 13, 2012.
Office Action for U.S. Appl. No. 12/883,652 dated Apr. 17, 2012.
Office Action for U.S. Appl. No. 12/884,993 dated Mar. 16, 2012.
Office Action for U.S. Appl. No. 13/014,622 dated Nov. 28, 2011.
Office Action for U.S. Appl. No. 13/014,622 dated Apr. 30, 2012.
Office Action for U.S. Appl. No. 13/046,565 dated Apr. 13, 2012.
Notice of Allowance for U.S. Appl. No. 12/502,058 dated Jul. 19, 2012.
Office action for U.S. Appl. No. 12/749,466 dated Jul. 3, 2012.
Notice of Allowance for U.S. Appl. No. 12/749,476 dated Jun. 26, 2012.
Office Action for U.S. Appl. No. 12/759,273 dated Jun. 26, 2012.
Notice of Allowance for U.S. Appl. No. 12/762,271 dated Aug. 8, 2012.
Notice of Allowance for U.S. Appl. No. 12/880,803 dated Jul. 18, 2012.
Office Action for U.S. Appl. No. 12/883,093 dated Aug. 3, 2012.
Office Action for U.S. Appl. No. 12/884,993 dated Aug. 2, 2012.
Office Action for U.S. Appl. No. 12/995,946 dated Mar. 28, 2012.
Office Action for U.S. Appl. No. 13/046,565 dated Jul. 19, 2012.
Chinese Office Action From Chinese Patent Application No. 200980134723.8 dated Nov. 1, 2012, 22 pgs. (With Translation).
Franssila, 'Tools for CVD and Epitaxy', Introduction to Microfabrication, 2004, pp. 329-336.
Office Action for U.S. Appl. No. 12/789,303 dated Sep. 24, 2012.
Office Action for U.S. Appl. No. 12/859,153 dated Sep. 25, 2012.
Notice of Allowance for U.S. Appl. No. 12/883,093 dated Nov. 21, 2012.
Notice of Allowance for U.S. Appl. No. 12/884,993 dated Nov. 26, 2012.
Office Action for U.S. Appl. No. 13/354,639 dated Nov. 7, 2012.
Notice of Allowance for U.S. Appl. No. 13/354,639 dated Dec. 14, 2012.
U.S. Appl. No. 12/942,817, filed Nov. 9, 2010, Pfister et al., unpublished.
U.S. Appl. No. 12/963,238, filed Sep. 20, 2010, Raring et al., unpublished.
U.S. Appl. No. 12/880,803, filed Sep. 13, 2010, Raring et al., unpublished.
U.S. Appl. No. 12/880,889, filed Sep. 13, 2010, Raring et al., unpublished.
U.S. Appl. No. 12/749,466, filed Mar. 29, 2010, Raring et al., unpublished.
U.S. Appl. No. 12/749,476, filed Mar. 29, 2010, Poblenz et al., unpublished.
U.S. Appl. No. 12/727,148, filed Mar. 18, 2010, Raring, unpublished.
U.S. Appl. No. 12/573,820, filed Oct. 5, 2009, Raring et al., unpublished.
U.S. Appl. No. 12/502,382, filed Jul. 14, 2009, Raring et al., unpublished.
U.S. Appl. No. 12/502,058, filed Jul. 13, 2009, Raring et al., unpublished.
U.S. Appl. No. 12/497,289, filed Jul. 2, 2009, Raring et al., unpublished.
Aoki et al., "InGaAs/InGaAsP MQW Electroabsorption Modulator Integrated with a DFB Laser Fabricated by Band-Gap Energy Control Selective Area MOCVD, 1993, "IEEE J Quantum Electronics, vol. 29, pp. 2088-2096.
Asano et al., "100-mW kink-Free Blue-Violet Laser Diodes with Low Aspect Ratio," 2003, IEEE Journal of Quantum Electronics, vol. 39, No. 1, pp. 135-140.
Bernardini et al., "Spontaneous Polarization and Piezoelectric Constants of III-V Nitrides," 1997, Physical Review B, vol. 56, No. 16, pp. 10024-10027.
Caneau et al., "Studies on Selective OMVPE of (Ga,In)/(As,P)," 1992, Journal of Crystal Growth, vol. 124, pp. 243-248.
Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Fujii et al., "Increase in the Extraction Efficiency of GaN-based Light-Emitting Diodes Via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.

Gardner et al. "Blue-emitting InGaN-GaN double-heterostructure light-emitting diodes reaching maximum quantum efficiency above 200 A/ cm2", Applied Physics Letters 91, 243506 (2007).

hap ://techon.nikkeibp. co jp/english/NEWS_EN/20080122/146009.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Kim et al, "Improved Electroluminescence on Nonpolar m-plane InGaN/GaN Qantum Well LEDs", 2007, Physica Status Solidi (RRL), vol. 1, No. 3, pp. 125-127.

Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.

Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.

Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.

Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.

Purvis, "Changing the Crystal Face of Gallium Nitride." The Advance Semiconductor Magazine, vol. 18, No. 8, Nov. 2005.

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-plane InGaN/GaN Laser Diodes," 2007, Journal of Japanese Applied Physics, vol. 46, No. 9, pp. 190-191.

Schmidt et al., "High Power and High External Efficiency m-plane InGaN Light Emitting Diodes," 2007, Japanese Journal of Applied Physics, vol. 46, No. 7, pp. L126-L128.

Shchekin et al., "High Performance Thin-film Flip-Chip InGaN-GaN Light-emitting Diodes," 2006, Applied Physics Letters, vol. 89, pp. 071109-071109-3.

Shen et al. "Auger recombination in InGaN measured by photoluminescence," Applied Physics Letters, 91, 141101 (2007).

Sizov et al., "500-nm Optical Gain Anisotropy of Semipolar (1122) InGaN Quantum Wells," 2009, Applied Physics Express, vol. 2, pp. 071001-1-071001-3.

Tomiya et. al. Dislocation related issues in the degradation of GaN-based laser diodes, IEEE Journal of Selected Topics in Quantum Electronics vol. 10, No. 6 (2004).

Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.

Uchida et al.,"Recent Progress in High-Power Blue-violet Lasers," 2003, IEEE Journal of Selected Topics in Quantum Electronics, vol. 9, No. 5, pp. 1252-1259.

Waltereit et al., "Nitride Semiconductors Free of Electrostatic Fields for Efficient White Light-emitting Diodes," 2000, Nature: International Weekly Journal of Science, vol. 406, pp. 865-868.

Wierer et al., "High-power AlGaInN Flip-chip Light-emitting Diodes," 2001, Applied Physics Letters, vol. 78, No. 22, pp. 3379-3381.

Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.

Yoshizumi et al. "Continuous-Wave operation of 520 nm Green InGaN-Based Laser Diodes on Semi-Polar {20-21} GaN Substrates," Applied Physics Express 2 (2009). -1310 1410.

Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Office action for U.S. Appl. No. 12/573,820 (Oct. 11, 2011).
Office action for U.S. Appl. No. 12/749,466 (Feb. 3, 2012).
Office action for U.S. Appl. No. 13/046,565 (Feb. 2, 2012).
Office action for U.S. Appl. No. 13/046,565 (Nov. 7, 2011).
Office action for U.S. Appl. No. 12/484,924 (Oct. 31, 2011).
Office action for U.S. Appl. No. 12/497,289 (Feb. 2, 2012).
Office action for U.S. Appl. No. 12/759,273 (Nov. 21, 2011).
Office action for U.S. Appl. No. 12/762,269 (Oct. 12, 2011).
Office action for U.S. Appl. No. 12/762,271 (Dec. 23, 2011).
Office action for U.S. Appl. No. 12/778,718 (Nov. 25, 2011).
Notice of Allowance for U.S. Appl. No. 12/762,278 (Nov. 7, 2011).

Abare "Cleaved and Etched Facet Nitride Laser Diodes," IEEE Journal of Selected Topics in Quantum Electronics, vol. 4, No. 3, pp. 505-509 (May 1998).

Asif Khan "Cleaved cavity optically pumped InGaN-GaN laser grown on spinel substrates,"Appl. Phys. Lett. 69 (16), pp. 2418-2420 (Oct. 14, 1996).

Lin et al."Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).

Okamoto et al. In "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).

Park, "Crystal orientation effects on electronic properties of wurtzite InGaN/GaN quantum wells,",Journal of Applied Physics vol. 91, No. 12, pp. 9904-9908 (Jun. 2002).

Romanov "Strain-induced polarization in wurtzite III-nitride semipolar layers," Journal of Applied Physics 100, pp. 023522-1 through 023522-10 (Jul. 25, 2006).

Schoedl "Facet degradation of GaN heterostructure laser diodes," Journal of Applied Physics vol. 97, issue 12, pp. 123102-1 to 123102-8 (2005).

* cited by examiner

Figure 7: Spectral broadening with RF modulation

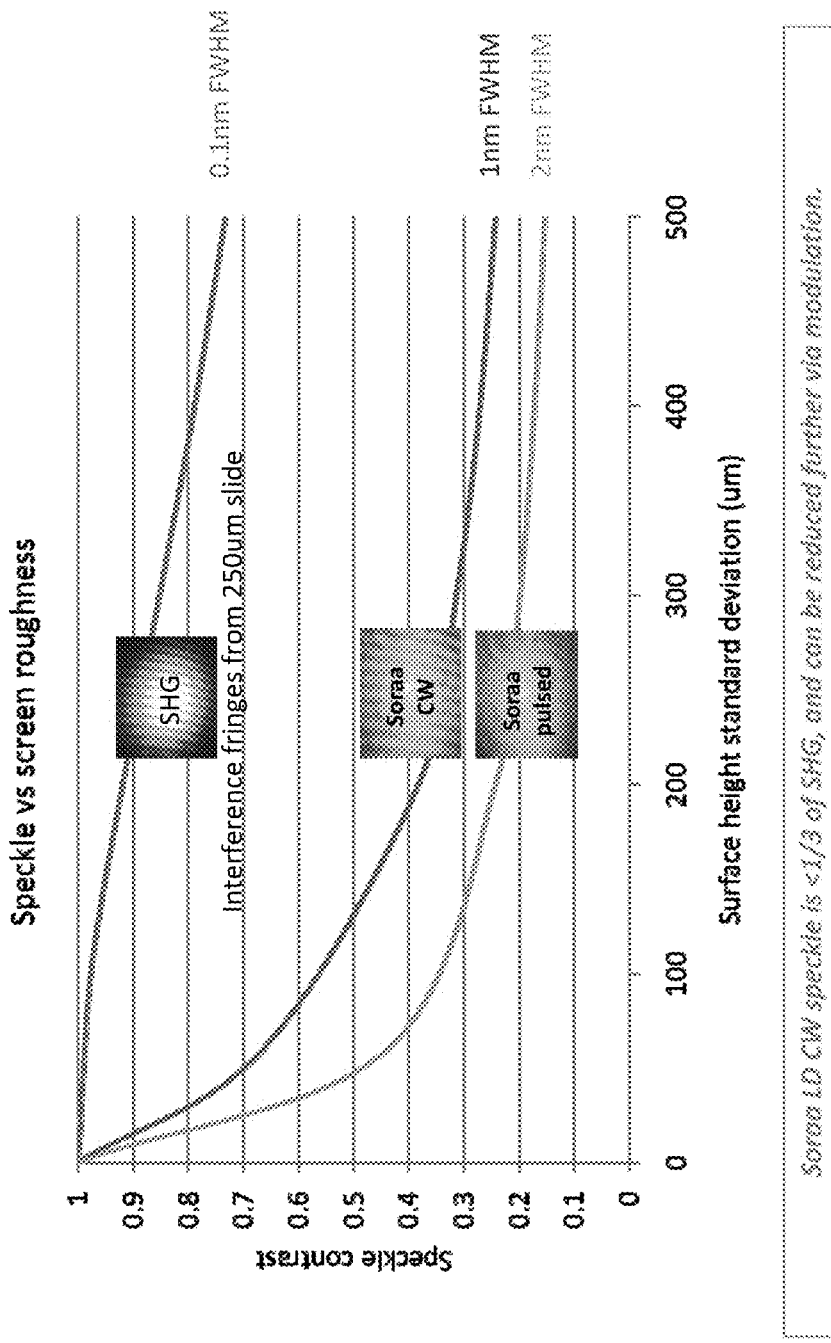

METHOD AND SYSTEM FOR PROVIDING BIDIRECTIONAL LIGHT SOURCES WITH BROAD SPECTRUM

CROSS-REFERENCE TO RELATED APPLICATION

This Application claims priority to U.S. Provisional Patent Application No. 61/345,561, filed May 17, 2010, which is incorporated by reference herein for all purposes.

BACKGROUND OF THE INVENTION

The present invention is directed to a system, method, and device for optical techniques. More specifically, the present device provides a laser diode with broad or multi-peaked spectral output. In certain embodiments, multi-peak spectral output is obtained by having a single laser diode device generating multiple-peak or broad spectral outputs. In a specific embodiment, a laser diode is configured to operate in superluminescene mode. In other embodiments, a laser diode provides multiple-peak or broad spectral outputs by having an RF source and/or a feedback signal. In some embodiments, the multi-peak outputs are achieved by having multiple laser devices output different lasers at different wavelengths.

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

Various types of lasers as described above have many applications. Typically, these laser devices emit laser light having a spectrum width of less than 1 nm. For example, "spectral width" refers to the full-width at half-maximum (FWHM) of the spectral envelope emitted from the light emitting device. Narrow laser spectrum is preferred for certain type of application, such as laser pointing device. However, narrow spectrum laser devices are often unsuitable to applications such as laser-based projection. In various applications, broad spectrum (e.g., a spectral width of 1 nm or greater) is often desirable.

BRIEF SUMMARY OF THE INVENTION

This invention provides a gallium and nitrogen containing (e.g., GaN) laser diode having a broad or multi-peaked spectral output. The device includes a gallium and nitrogen containing substrate having a first crystalline surface region orientation. The device also includes an active region having at least one quantum well, each of the quantum wells having a thickness of at least 2.0 nm and at least one barrier layer. Each of the barrier layers has a thickness ranging from about 2 nm to about 20 nm. Each of the barrier layers is configured between a pair of quantum wells. The device also includes a cavity member at least 100 um long over the active region. The cavity has a width of at least 0.5 um, with one end having reflectivity of at least 90% and the other end having reflectivity of 0.5% or less. The cavity member is emits laser light characterized by a spectral width of at least 1 nm.

In another embodiment the device also includes an active region including a barrier layer and a light emission layer characterized by a graduated profile associated with a peak emission wavelength gradient. The peak emission wavelength gradient has a deviation of about 1 to 40 nm. The device includes a cavity member over a first portion of the emission layer. The cavity member has a length of at least 100 um and a width of at least 0.5 um. A second cavity member overlies a second portion of the emission layer, the second portion of the emission layer being associated with a second wavelength which is within 50 nm of the first wavelength. The second cavity member has a length of at least 100 um and a width of at least 0.5 um.

In another embodiment, the first emission layer is characterized by a first gain peak wavelength, and the second emission layer is characterized by a second gain peak wavelength. The difference between the first gain peak wavelength and the second gain peak wave length is at least 1 nm.

A method for making the device includes growing a plurality of light emission layers within the active region using a selective area epitaxy process. In addition the method can include growing a first emission layer within the first active region, the first emission layer having a first gain peak wavelength. The method additionally includes defining a second active region by performing a selective etching process, and growing a second emission layer within the second active area, which is characterized by a second gain peak wavelength.

According to yet another embodiment, the device also includes an active region comprising a barrier layer and a plurality of light emission layers, which includes a first emission layer and a second emission layer. The barrier layer is characterized by a first energy level. The first emission layer is characterized by a first gain peak wavelength and a second lower energy level. The first emission layer has a first amount of atoms diffused from the barrier layer. The second emission layer is characterized by a second gain peak wavelength. The difference between the first gain peak wavelength and the second gain peak wave length is at least 1 nm.

According to yet another embodiment, the device includes a current source, and the first active region is electrically coupled to the current source. The first peak wavelength is based on a first amount of current received from the current source. The device also includes a second active region electrically coupled to the current source. The second peak wavelength is based on a second amount of current received from the current source.

According to yet another embodiment, the device includes an active region comprising at least one quantum well or double hetereostructure and one barrier layer. The device additionally includes an RF source electrically coupled to the active region for providing RF modulation, which is configured to induce mode hopping or modulation of the peak wavelength. The RF modulation can be applied in addition to the direct current (DC) or alternating current (AC) required to drive the laser for the given application. The RF signal functions to broaden the spectral output of the laser device by at least 20% or at least 50%. The cavity member is configured to emit laser characterized by a spectral width of at least 1 nm. In another embodiment, the device also includes an optical feedback signal source coupled to the optical cavity for inducing mode hopping or spectral broadening.

According to yet another embodiment, the device also includes a region of insulating material having two or more growth regions provided on the surface region. The two or more growth regions are exposed regions of the surface region. The device additionally includes an array configuration formed by the growth regions. The device also includes a first semi-polar gallium indium containing crystalline material provided on a portion of the first growth region of the gallium containing substrate structure, the first semi-polar gallium indium containing crystalline material having a thickness of about 1 nanometers to about 20 nanometers. A second semi-polar gallium indium containing crystalline material is provided on a portion of the second growth region. The second semi-polar gallium indium containing crystalline material having a thickness of about 1 nanometers to about 20 nanometers. The device includes a indium concentration characteristic associated with the wavelength characteristics.

According to yet another embodiment, the present invention provides a method for manufacturing an optical device. The method includes providing a gallium containing substrate structure having a surface region, then defining a region of insulating material having growth regions. The method includes providing a semi-polar gallium indium containing crystalline material on the growth regions, preferably having a thickness of about 1 nanometer to about 20 nanometers.

The present invention enables a cost-effective optical device for laser applications. The optical device can be manufactured in a relatively simple and cost effective manner. In some embodiments, the laser device is capable of emitting broad spectrum of wavelengths having a spectral width of about 1 nm to 10 nm. Preferably, the laser diode is formed on a nonpolar or semipolar gallium and nitrogen containing material such as the {20-21} or the {20-2-1} or miscuts from these planes configured for emissions at about 510 nm and greater.

BRIEF DESCRIPTION OF THE DRAWINGS

FIG. 9 illustrates reduced speckle in laser displays.

DETAILED DESCRIPTION OF THE INVENTION

In certain embodiments, multi-peak spectral output is obtained by having a single laser diode device generating multiple-peak spectral outputs. In a specific embodiment, a laser diode is configured to operate in superluminiscene or like mode. In other embodiments, a laser diode provides multiple-peak spectral outputs by having an RF source and/or a feedback signal. In some other embodiments, multi-peak outputs are achieved by having multiple laser devices output different lasers at different wavelengths.

In various embodiments, the invention provides broad spectrum laser diode devices implemented using superluminescent diodes (SLD) on nonpolar and semipolar Ga-containing substrates for use as the light source in applications where broad spectral output is preferred. Since superluminescent diodes can be designed to achieve both high brightness and broad spectral properties while maintaining the beam characteristics and high output directionality of light laser diodes, such SLDs are suited for applications where typical laser diodes cannot provide adequate spectral width for optimal system performance. For example, wide spectrum laser devices are useful in laser display applications.

It is known that a superluminescent diode (SLD) is an edge-emitting semiconductor light source based on superluminescence scheme. It combines the high power and brightness of laser diodes with the low coherence of conventional light-emitting diodes. The typical emission band for SLD is about 10 to 100 nm wide.

Figure 1:
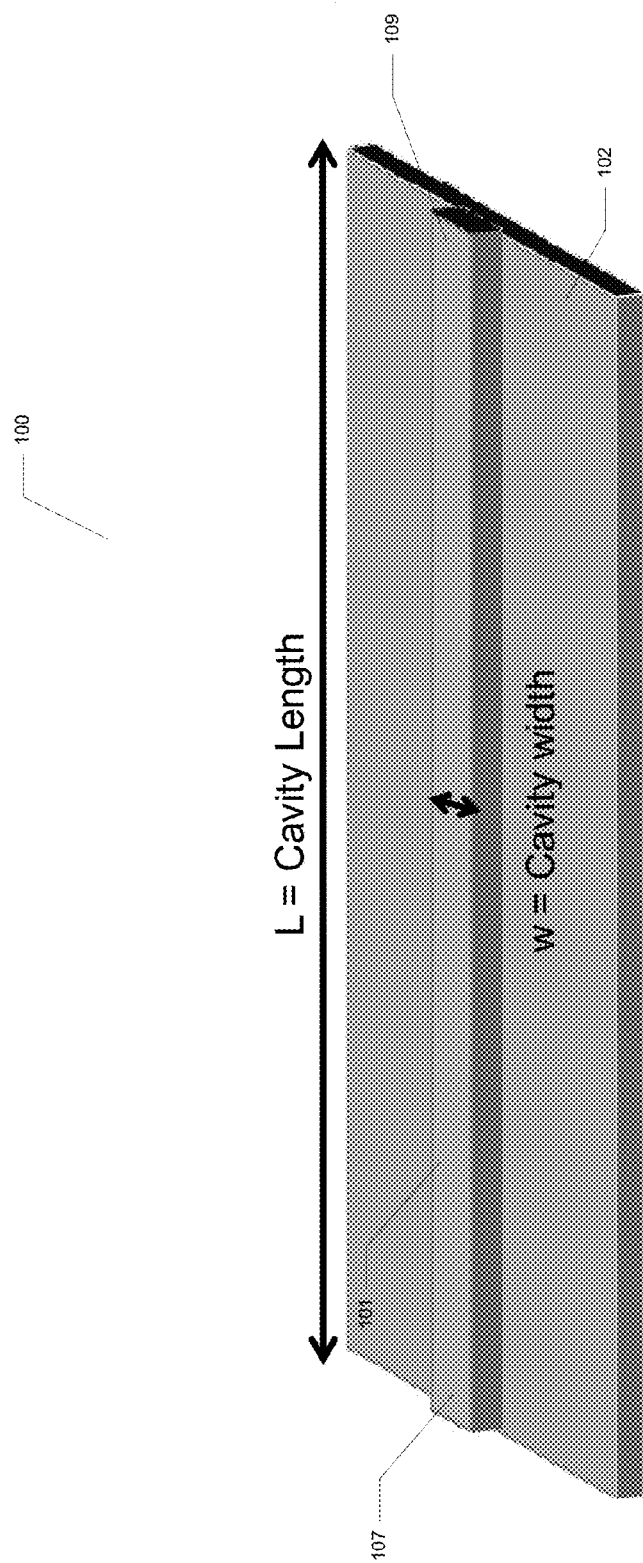
FIG. 1 is a diagram illustrating a wide-spectrum laser diode implemented using a super luminescence diode (SLD)

FIG. 1 is a diagram illustrating a wide-spectrum laser diode implemented using SLD. As shown in FIG. 1, an optical device 100 includes a substrate member 102. An active region, not shown in FIG. 1, is positioned within the substrate member 102. The substrate member 102 includes both light emitting layers and cladding layers.

The device illustrated in FIG. 1 may be implemented with substrate member 102 having a surface region on the polar plane (c-plane), nonpolar plane (m-plane, a-plane), and semipolar plain ({11-22}, {10-1-1}, {20-21}, {30-31}, {20-2-1}, {30-3-1}). For example, substrate may also be implemented using semipolar or non-polar gallium containing substrates such as GaN, MN, InN, InGaN, AlGaN, and AlInGaN, and others. In a specific embodiment, the substrate is a gallium and nitrogen containing {20-21} or {20-2-1} substrate which could be miscut towards the c-plane or towards the a-plane according to one or more embodiments, but there can be other configurations.

The substrate 102 comprises gallium nitride material and is a bulk GaN substrate characterized by having a semipolar or non-polar crystalline surface region. In a specific embodiment, the bulk nitride GaN substrate includes nitrogen and has a surface dislocation density below $10^5$ cm$^{-2}$ to about $10^8$ cm$^{-2}$. The nitride crystal or wafer may comprise $Al_xIn_yGa_{1-x-y}N$, where $0 \leq x, y, x+y \leq 1$. The GaN substrate usually has threading dislocations, at a concentration between about $10^5$ cm$^{-2}$ and about $10^8$ cm$^{-2}$, in a direction that is substantially orthogonal or oblique with respect to the surface. As a consequence of the dislocations, the surface dislocation density is below about $10^5$ cm$^{-2}$ or about $10^8$ cm$^{-2}$. The device can be fabricated on a slightly off-cut semipolar substrate as described in U.S. Provisional No. 61/164,409 filed Mar. 28, 2009, commonly assigned, and hereby incorporated by reference.

The optical device 100 also includes a cavity member 101. As shown in FIG. 1, the cavity member is positioned on top of the substrate member 102. In one embodiment, the cavity member 101 is positioned directly above the active region of the substrate member and is a part of a laser stripe region. The laser stripe region is characterized by a cavity orientation substantially in a projection of a c-direction (along the length of the cavity member 101 as shown), which is substantially normal to an a-direction. The laser strip region has a first end 107 and a second end 109. In a preferred embodiment, the device is formed on a projection of a c-direction on a {20-21} or {20-2-1} gallium and nitrogen containing substrate having a pair of cleaved surfaces at the first and second ends.

The optical device 100 is formed using epitaxial growth and cleave properties on semipolar crystal planes oriented between the nonpolar m-plane and the polar c-plane. In particular, the substrate grown on the {30-31} and {20-21} families of crystal planes, which includes {30-3-1} and {20-2-1}. The epitaxy structures and cleaves allow efficient laser diodes operating at wavelengths from about 400 nm to green, e.g., 500 nm to 540 nm. These results include bright blue epitaxy in the 450 nm range, bright green epitaxy in the 520 nm range, and smooth naturally occurring cleave planes orthogonal to the projection of the c-direction. It is desirable to align the laser cavities parallel to the projection of the c-direction for maximum gain on this family of crystal planes. Using these technologies, we have demonstrated a laser device on {20-21} operating at 522 nm with a cavity oriented in the projection of the c-direction. An example of one or more laser devices is described in U.S. Provisional No. 61/243,502 filed Sep. 17, 2009, commonly assigned, and hereby incorporated by reference for all purposes.

In a preferred embodiment, the device has a first cleaved facet provided on the first end 107 of the laser stripe region and a second cleaved facet provided on the second end 109 of the cavity member 101. In one or more embodiments, the first cleaved is substantially parallel with the second cleaved facet. Smooth surfaces with different reflectivities are formed on each of the cleaved surfaces. The first cleaved facet comprises a highly reflective surface. For example, the reflectivity of the first surface is 90% or greater. In a preferred embodiment, the first cleaved surface is provided by a top-side skip-scribe scribing and breaking process. The scribing process can use any suitable techniques, such as a diamond scribe or laser scribe or combinations. Typically, the surface resulting from the scribing process is not up to a desired reflectivity. In a specific embodiment, the first mirror surface comprises a reflective coating, which increase cause the first mirror surface to have the desired reflectivity. The reflective coating is selected from silicon dioxide, hafnia, and titania, tantalum pentoxide, zirconia, including combinations, and the like.

The second cleaved surface comprises an anti-reflective coating. As explained above, the cleaved surface may not have the desired reflectivity (either high or low). To make the second cleaved surface anti-reflective (or have a very low level of reflectivity), an anti-reflective coating is applied. For example, the second cleaved surface is characterized by a reflectivity of less than 0.5%. In one specific embodiment, the second cleaved surface is characterized by a reflectivity of less than 0.05%.

As explained above, the optical device 100 is configured to provide wide spectrum laser with a spectral width of 1-20 nm. More specifically, the optical device 100 utilizes a superluminescent diode (SLD design). In a specific embodiment where a superluminescent diode is used, a laser diode geometry can be employed where the cavity length can range from 100 um to 3000 um and the cavity width can range from 0.5 um to 50 um.

Depending on the specific implementations, optical confinement of the mode or waveguiding can be achieved with index guiding or gain guiding. In one embodiment where an index guided scheme is used, transverse confinement is a result of the higher index associated with the light emitting layers relative to the cladding layers. In one specific embodiment, one or more InGaN emitting layers are sandwiched between GaN cladding layers.

Lateral index guiding could be achieved with various types of designs, which include surface ridge laser architectures, deep ridge architectures, buried hetereostructure architectures, and disordering of the light emitting constituent layers. In alternative embodiments, lateral modal confinement is provide to utilize gain guiding such that selective excitation of the gain providing material with electrical carriers dictates the lateral extent of the optical field. An example of this approach would be a wide stripe broad area laser that uses metal electrodes to selectively excite the material.

As described above, the cavity member 107 have cleaved surfaces at the first end 107 and the second end 109. Reflectivity of the cleaved surfaces can be modified in various ways, such as by application of coatings that can either increase the reflectivity for high-reflectivity (FIR) coatings or decrease the reflectivity for anti-reflective (AR) coatings. Such coatings are often formed by deposition of carefully designed dielectric stacks in which the dielectric layers' index, thickness, and number of periods sets the reflectivity. Conventional laser diodes are designed with mirror reflectivity to provide the best efficiency trade-off of output power and threshold current for the required application. For applications where low threshold current and low power are required, HR coatings are often employed on both mirrors on the cavity with the front mirror where light will be collected from having slightly lower reflectivity. For applications where high powers are required and the threshold current has a reduced influence on the efficiency, an HR coating is used for the back mirror and an AR coating is often used for the front mirror since the reduced reflectivity of the AR-coated mirror will allow more light to escape the cavity for higher output powers. An alternative embodiment would use an angled mirror facet to reduce the reflectivity of the front mirror. This could be used in addition to an anti-reflective coating.

The SLD design according to embodiments of the present invention operates in accordance to superluminescent principles. For example, in case of spontaneous emission, semiconductors typically exhibit an emission spectra with a full width at half maximum (FWHM) on the order of 15-100 nm, depending on the material system and center emission wavelength. An example of such a device operating in nearly complete spontaneous regime would be a light emitting diode (LED). For case of the laser diode where optical feedback is present and stimulated emission is present, the emission spectra narrows as the optical intensity increases and the output becomes more coherent. In a conventional multi-longitudinal mode laser, the output spectrum narrows to ~1 nm at the onset of lasing, which is not desirable for light sources in many applications. By reducing the reflectivity of the front mirror to the point where the device cannot achieve threshold, the lasing action, and hence spectral narrowing, can be suppressed and the device will operate as a superluminescent diode (SLD). By careful design and control over the cavity design, the SLD can be made to operate with spectral widths ranging from 1 to 20 nm.

In various embodiments, the present invention provides a method for fabricating SLD devices on nonpolar and semipolar Ga containing substrates for applications where high brightness and broad spectral width are desired. In one embodiments, conventional semiconductor laser fabrication techniques can be employed with emphasis on the gain and loss properties of the cavity such that the optimal spectral width and brightness can be achieved in an output beam similar to that of a laser diode. As shown in FIG. 1, an edge emitting superluminescent diode is implemented using a laser diode architecture with an AR coating on the front mirror 109 to prevent lasing. Practical values for the AR coating power reflectivity can be from 0.0001 to 0.5%.

In some embodiments multiple emitters operating at different peak wavelengths are used, i.e. two or more spectral lasing peaks. Two or more spectral peaks are achieved by positioning laser diode cavities adjacent to each other such that the side-by-side emitters operate at different peak wavelengths.

Figure 2A:
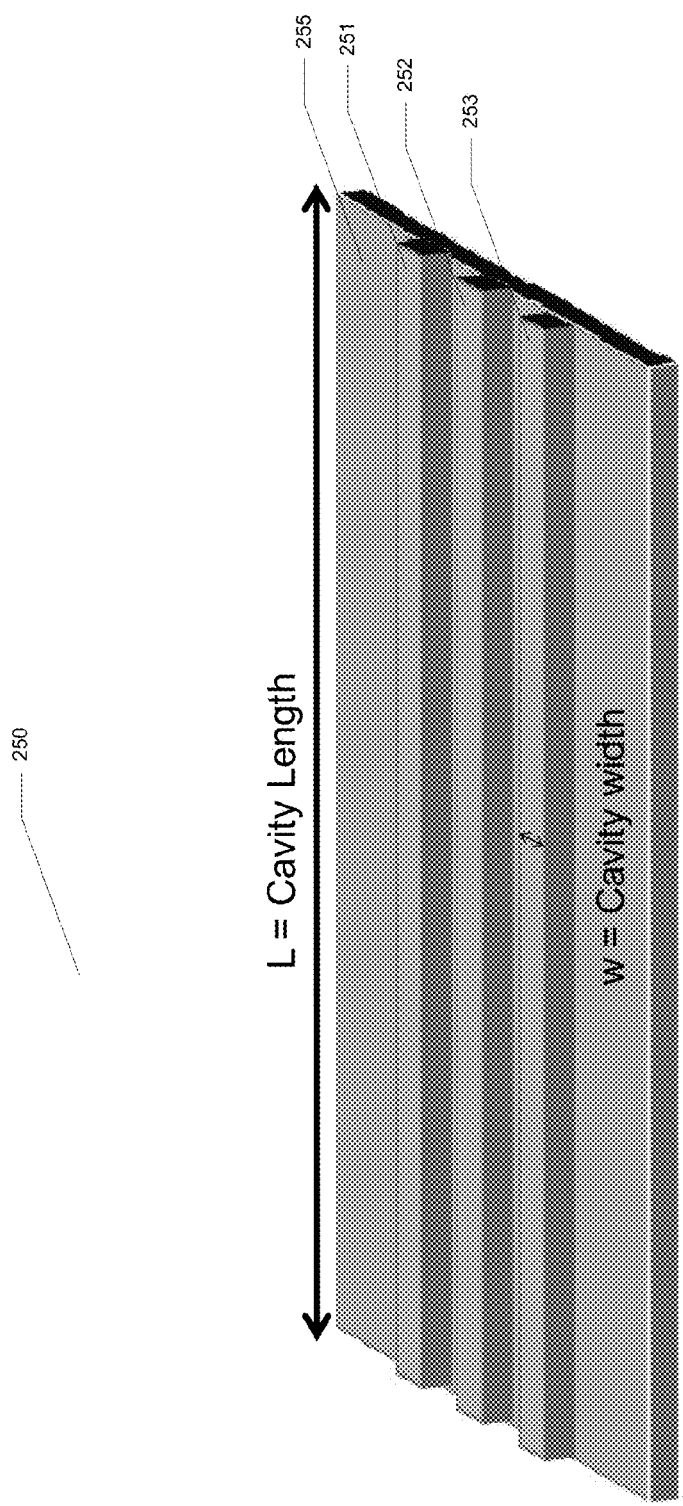
FIG. 2A is schematic diagram illustrating a side-by-side emitter configuration.

One way to create a lasing output spectrum with two or more peaks involves positioning two or more laser cavities side-by-side such that the individual output spectrums could be convoled and captured into a single beam. Adjacent laser diodes can utilize conventional in-plane laser geometries with cavity lengths ranging from 100 um to 3000 um and cavity widths ranging from 0.5 um to 50 um. In a specific embodiment, side-by-side lasers are separated from one another at distances of about 1 um to 500 um. Depending on the application, these lasers can share a common set of electrodes or use separate electrodes. FIG. 2A is schematic diagram illustrating a side-by-side emitter configuration according to an embodiment of the present invention.

As shown in FIG. 2A, an optical device 250 includes a substrate 255. A plurality of cavities 251, 252, and 253 are provided on the substrate 255. Each cavity is associated with a laser device that is configured to emit a specific wavelength. For example, each laser device emits laser light having about 1~10 nm difference in wavelength from its adjacent laser device. In a specific example, laser devices as shown in optical device 250 have wavelengths of 530 nm, 532 nm, and 535 nm, and when combined the laser devices provide a laser light with relative wider spectrum compared to conventional laser devices. It is to be appreciated that the wide-spectrum laser light as provided by embodiments of the present invention are preferred for a variety of laser displayer and projection applications, as narrow spectrum laser lights typically cause speckles.

Figure 2B:
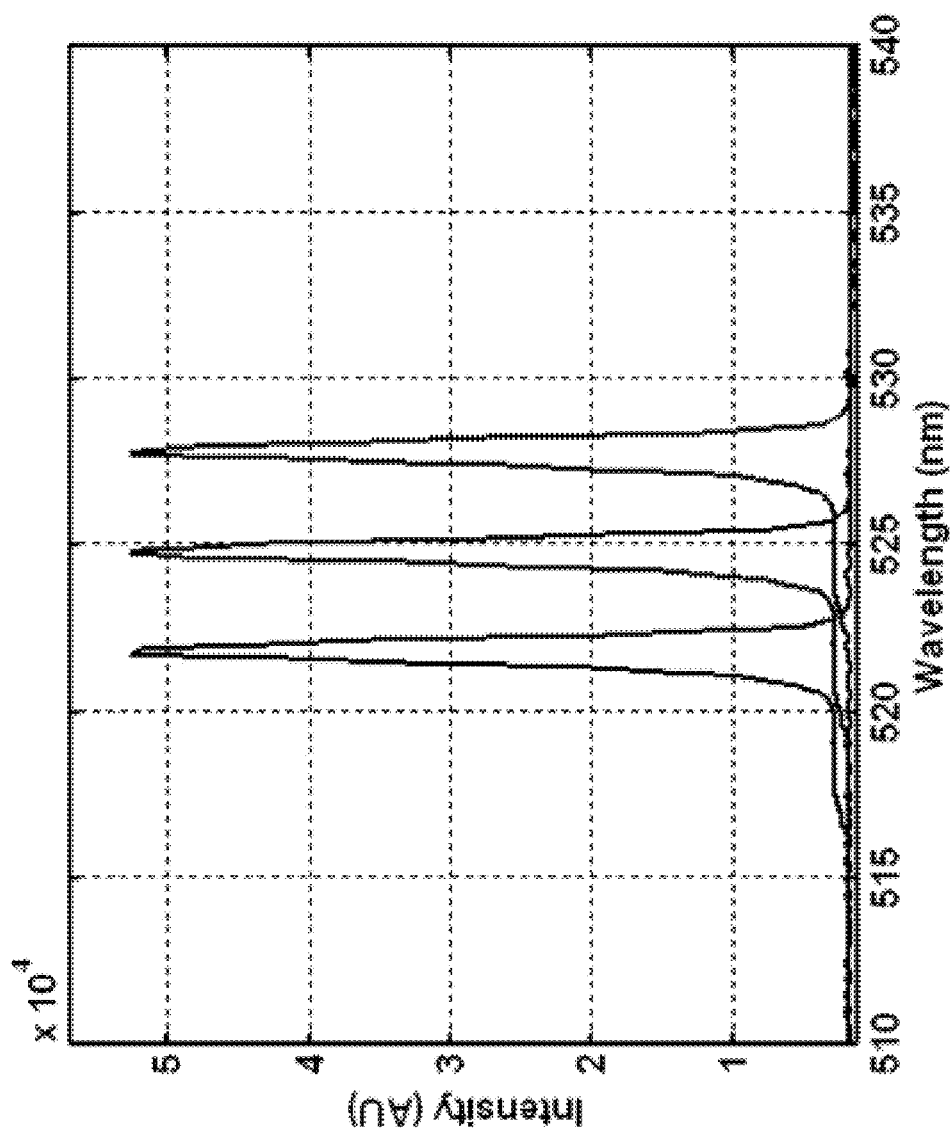
FIG. 2B is a diagram illustrating a possible multi-peaked lasing spectrum in the green wavelength regime.

FIG. 2B is a diagram illustrating a multi-peaked lasing spectrum in the green wavelength regime. The multi-peak lasing spectrum may be produced in the blue or red wavelength regime as well. As shown in FIG. 2B, three peaks of laser spectrum respectively at about 523 nm, 525 nm, and 527 nm are provided at an intensity of over $5 \times 10^4$ AU.

Figure 2C:
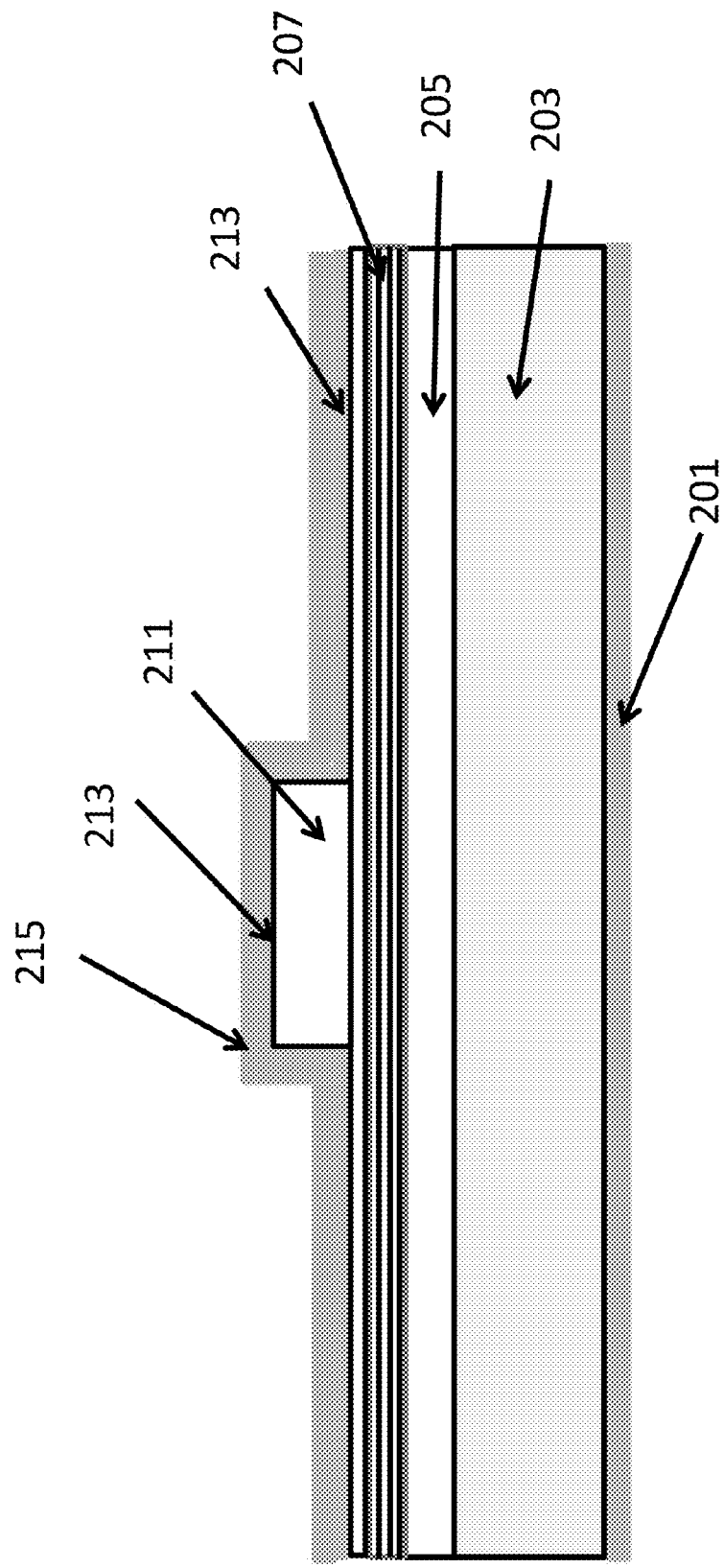
FIG. 2C is a cross-sectional view of a laser device 200 fabricated on a {20-21} substrate.

FIG. 2C is a detailed cross-sectional view of a laser device 200 fabricated on a {20-21} substrate. As shown, the laser device includes gallium nitride substrate 203, which has an underlying n-type metal back contact region 201. In a specific embodiment, the metal back contact region is made of a suitable material such as those noted below.

In a specific embodiment, the device also has an overlying n-type gallium nitride layer 205, an active region 207, and an overlying p-type gallium nitride layer structured as a laser stripe region 209. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where $0 \leq u$, $v$, $u+v \leq 1$, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 209. In a specific embodiment, the laser stripe is provided by an etching process selected from dry etching or wet etching. In a preferred embodiment, the etching process is dry. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific embodiment, the dielectric region is an oxide such as silicon dioxide or silicon nitride. The contact region is coupled to an overlying metal layer 215. The overlying metal layer is a multilayered structure containing gold and platinum (Pt/Au), nickel gold (Ni/Au).

In a specific embodiment, the laser device has active region 207 which can include one to twenty quantum well regions. As an example following deposition of the n-type $Al_uIn_vGa_{1-u-v}N$ layer for a predetermined period of time, so as to achieve a predetermined thickness, an active layer comprised of multiple quantum wells can be formed, e.g. with 2-10 quantum wells. The quantum wells preferably, InGaN with GaN barrier layers separating them. In other embodiments, the well layers and barrier layers comprise $Al_wIn_xGa_{1-y-z}N$ and $Al_yIn_zGa_{1-y-z}N$, respectively, where $0 \leq w$, x, y, z, w+x, y+z$\leq 1$, where w<u, y and/or x>v, z so that the bandgap of the well layer(s) is less than that of the barrier layer(s) and the n-type layer. The well layers and barrier layers may each have a thickness between about 1 nm and about 20 nm. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s$, t, s+t$\leq 1$, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm.

As noted, the p-type gallium nitride structure is deposited above the electron blocking layer and active layer(s). The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry. The device also has an overlying dielectric region, which exposes 213 contact region. In a specific embodiment, the dielectric region is an oxide such as silicon dioxide.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

Depending on the application, a laser device may include multiple quantum wells to widen spectral width of laser devices. For example, typical multi-longitudinal-mode Fabry-Perot laser diodes exhibit a lasing spectrum with'envelope function containing the cavity modes that is 0.1 nm to 1.0 nm. As explained above, wider spectral envelopes would be desirable in laser display applications where speckle is a consideration. In various embodiments, blue lasers operating in the 435-460 nm range on nonpolar or semipolar substrates fabricated according to the present invention can have a broad lasing spectrum in the range of 3 to 6 nm. For example, the broad spectral range is accomplished by increasing the number of quantum wells from 3 to 7, in which a noticeable broadening is achieved (e.g., from which the full width at half maximum (FWHM) increases from about 1 nm to 2 nm). Further, when increasing the barrier thickness from the 4 nm to 7 nm range to the 8 nm to 12 nm range, the FWHM lasing spectrum can be increased to over 4 nm.

In one embodiment, a laser diode includes a gallium and nitrogen containing substrate including a first crystalline surface region orientation. The laser diode also includes an active region comprising at least four quantum wells, each of the quantum wells having a thickness of 3 nm and greater and one or more barrier layers, each of the barrier layers having a thickness of at least 4 nm, each of the barrier layers being configured between a pair of quantum wells. Additionally, the laser diode includes a cavity member overlaying the active region, the cavity member having a first end and a second end, the cavity member being configured to emit a highly directional beam of light characterized by a lasing spectrum full width half maximum of greater than 1.5 nm.

According to a specific embodiment, a laser diodes are fabricated on a nonpolar or semipolar substrate with a multiple quantum well active region containing 2 or more quantum wells that are 2 nm or greater in thickness, barriers that are 7 nm or greater, and a lasing spectrum full width half maximum of greater than 1.5 nm. In one embodiment, the peak wavelength of the lasing spectrum is in the 430 nm to 465 nm range. In another embodiment, the peak wavelength of the lasing spectrum is in the 510 nm to 550 nm range.

Figure 2D:
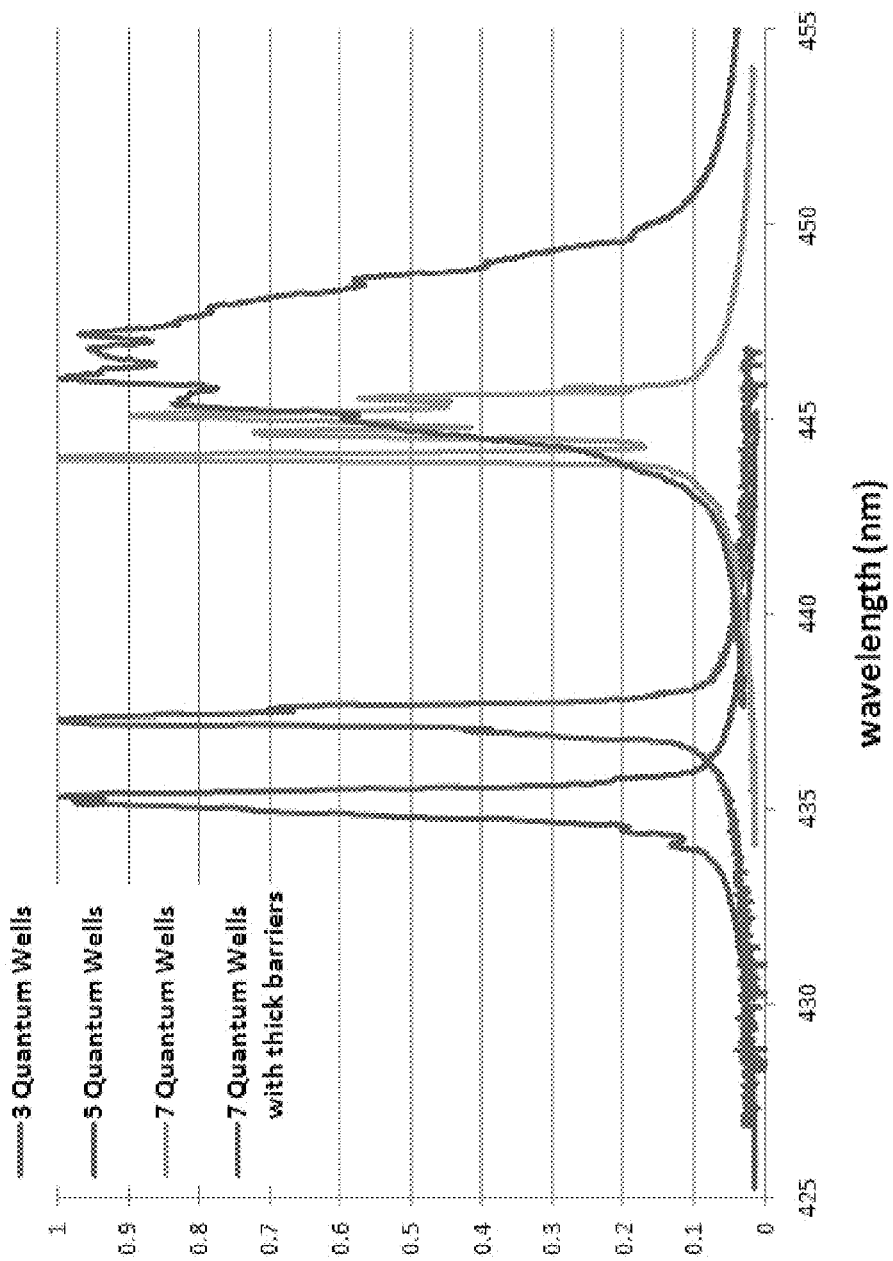
FIG. 2D is a diagram illustrating the output spectrum of laser diodes having a different number of quantum wells and different barrier thicknesses.

FIG. 2D is a diagram illustrating the output spectrum of laser diodes having a different number of quantum wells and different barrier thicknesses To achieve a multi-peaked output spectrum, the peak wavelengths of the adjacent laser devices need to be detuned from each other. According to various embodiments, gain and loss relationship in the individual lasers are manipulated such that the resulting lasing wavelengths are different by about 1 to 40 nm. Embodiments of the present invention provides various ways the gain and loss relationship can be achieved.

According to an embodiment, the as-grown material gain peak is varied spatially across a wafer. As a result, different peak wavelength can be obtained from one fabricated laser to the next laser on the same wafer. The as-grown gain peak wavelength can be shifted using various method according to embodiments of the present invention. The growth non-uniformity can be obtained a result of temperature and/or growth rate gradients in the light emitting layers in the epitaxial growth chamber. Such wavelength gradients can be intentional or non-intentional, and the differences in wavelengths range from 1 to 40 nm deviation. This method enables multiple lasers on the same chip to operate at different wavelengths.

According to an embodiment, the following steps are performed in a method for forming a device that includes laser devices having multiple wavelengths:
1. providing a gallium and nitrogen containing substrate including a first crystalline surface region orientation;
2. defining an active region;
3. forming a barrier layer within the active region;
4. growing a light emission layer, the light emission layer being characterized by a graduated profile associated with a peak emission wavelength gradient, the peak emission wavelength gradient having a deviation of about 1 to 40 nm;

5. forming a first cavity member overlaying a first portion of the emission layer, the first portion of the emission layer being associated with a first wavelength, the first cavity member being characterized by a length of at least 100 um and a width of at least 0.5 um; and 6. forming a second cavity member overlaying a second portion of the emission layer, the second portion of the emission layer being associated with a second wavelength, a difference between the first and second wavelengths being less than 50 nm, the second cavity member being characterized by a length of at least 100 um and a width of at least 0.5 um.

As explained above, the substrate member may have a surface region on the polar plane (c-plane), nonpolar plane (m-plane, a-plane), and semipolar plain ({11-22}, {10-1-1}, {20-21}, {30-31}.{20-2-1}, {30-3-1}). Depending on the specific application, the graduated profile for the light emission layer may be formed in various ways, such as providing temperature gradient when forming the emission layer. In a specific embodiment, the graduated profile for the light emission layer is formed having a growth rate gradient as the light emission layer is formed. There are other ways for obtaining graduated profile in the light emission layer as well.

In a specific embodiment, a laser apparatus having a broad spectrum is provided. The laser apparatus includes a gallium and nitrogen containing substrate including a first crystalline surface region orientation. For example, the substrate member may have a surface region on the polar plane (c-plane), nonpolar plane (m-plane, a-plane), and semipolar plain ({11-22}, {10-1-1}, {20-21}, {30-31}, {20-2-1}, {30-3-1}). The laser apparatus also includes an active region comprising a barrier layer and a light emission layer, the light emission layer being characterized by a graduated profile associated with a peak emission wavelength gradient, the peak emission wavelength gradient having a deviation of about 1 to 40 nm. In various embodiments, the active region may include multiple active and barrier layers, as well as cladding layers. For example, the various layers of the active layer are doped in n or p type. The laser apparatus includes a first cavity member overlaying a first portion of the emission layer, the first portion of the emission layer being associated with a first wavelength, the first cavity member being characterized by a length of at least 100 um and a width of at least 0.5 um. The laser apparatus also includes a second cavity member overlaying a second portion of the emission layer, the second portion of the emission layer being associated with a second wavelength, a difference between the first and second wavelengths being less than 50 nm, the second cavity member being characterized by a length of at least 100 um and a width of at least 0.5 um. Depending on the implementation, the laser apparatus may includes additional cavity members overlaying the active region and correspond to different wavelengths. For example, the cover members have mirror surfaces and function as waveguide for the laser devices.

Figure 2E:
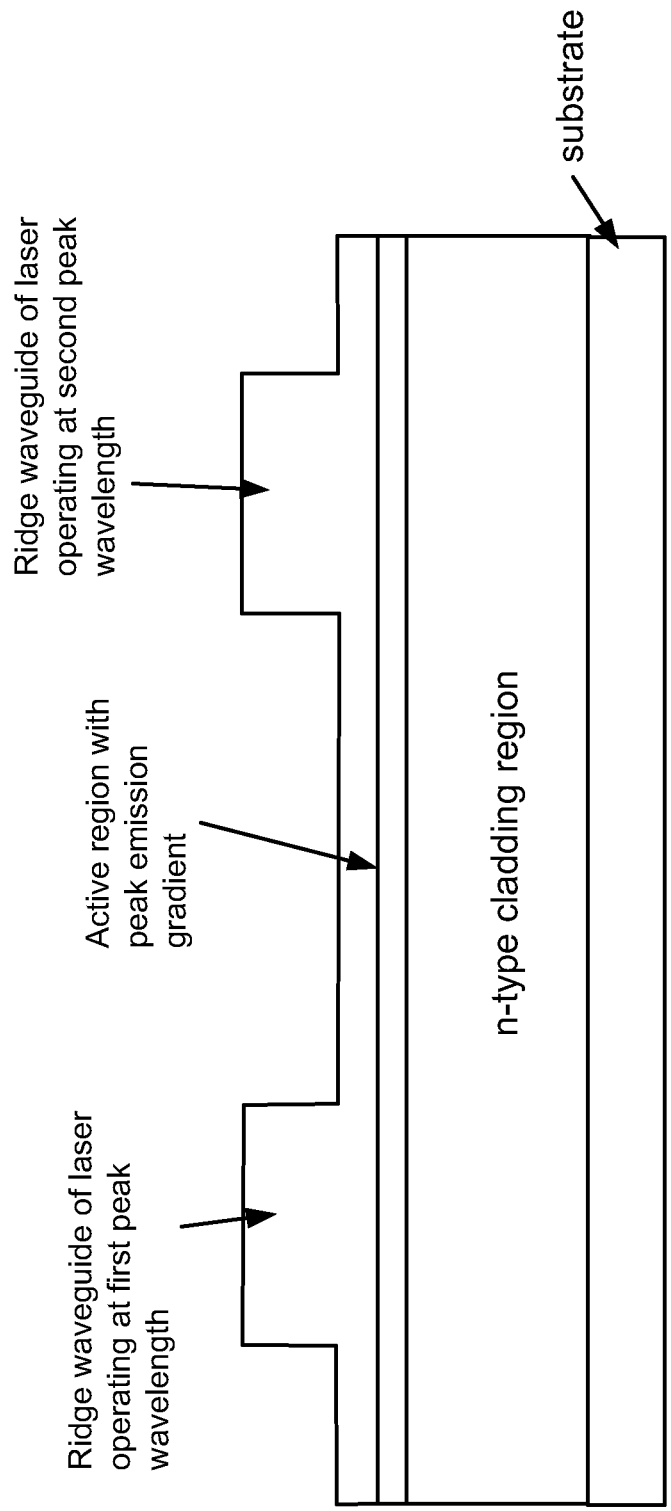
FIG. 2E is a diagram illustrating a laser device having an active region with graded emission wavelength.

FIG. 2E is a diagram illustrating a laser device having an active region with graded emission wavelength. In certain embodiments of the present invention, multiple laser peak wavelength is obtained by manipulating the as-grown gain peak through selective area epitaxy (SAE), where dielectric patterns are used to define the growth area and modify the composition of the light emitting layers. Among other things, such modification of the composition can be used to cause different gain peak wavelengths and hence different lasing wavelengths. For example, by using SAE, the device designer can have a high degree of spatial control and can safely achieve 10-30 nm of wavelength variation over the lasers. For example, the SAE process is described in a U.S. patent application Ser. No. 12/484,924, filed Jun. 15, 2009, titled "Selective Area Epitaxy Growth Method and Structure for Multi-Color Devices." This method enables multiple lasers on the same chip to operate at different wavelengths.

According to an embodiment, the following steps, using SAE techniques, are performed in a method for forming a device that includes laser devices having multiple wavelengths:

1. providing a gallium and nitrogen containing substrate including a first crystalline surface region orientation;
2. defining an active region;
3. forming a barrier layer within the active region;
4. growing a plurality of light emission layers within the active region using a selective area epitaxy process, the plurality of light emission layers including a first emission layer and a second emission layer, the first emission layer being characterized by a first gain peak wavelength, the second emission layer being characterized by a second gain peak wavelength, a difference between the first gain peak wavelength and the second gain peak wave length being at least 10 nm;
5. forming a first cavity member overlaying the first emission layer, the first cavity member being characterized by a length of at least 100 um and a width of at least 0.5 um; and
6. forming a second cavity member overlaying the second the emission layer, the second cavity member being characterized by a length of at least 100 um and a width of at least 0.5 um.

It is to be appreciated that the method described above can be implemented using various types of substrate. As explained above, the substrate member may have a surface region on the polar plane (c-plane), nonpolar plane (m-plane, a-plane), and semipolar plain ({11-22}, {10-1-1}, {20-21}, {30-31}, {20-2-1}, {30-3-1}). For example, during the growth phase of the light emission layer, growth areas are defined by dielectric layers. In a specific embodiment, the emission layers at each of the growth area have different spatial dimensions (e.g., width, thickness) and/or compositions (e.g., varying concentrations for indium, gallium, and nitrogen). In a preferred embodiment, the growth areas a configured with one or more special structures that include from annular, trapezoidal, square, circular, polygon shaped, amorphous shaped, irregular shaped, triangular shaped, or any combinations of these. For example, each of the emission layers is associated with a specific wavelength. As explained above, differences in wavelength among the emission layers may can range from 1 nm to 40 nm.

In a specific embodiment, a laser apparatus manufactured using SAE process and having a broad spectrum is provided. The laser apparatus includes a gallium and nitrogen containing substrate including a first crystalline surface region orientation. For example, the substrate member may have a surface region on the polar plane (c-plane), nonpolar plane (m-plane, a-plane), and semipolar plain ({11-22}, {10-1-1}, {20-21}, {30-31}, {20-21}, {30-31}). The laser apparatus also includes an active region comprising a barrier layer and a plurality of light emission layers, the plurality of light emission layers including a first emission layer and a second emission layer, the first emission layer being characterized by a first gain peak wavelength, the second emission layer being characterized by a second gain peak wavelength, a difference between the first gain peak wavelength and the second gain peak wave length is at least 10 nm. In various embodiments, the active region may include multiple active and barrier layers, as well as cladding layers. For example, the various layers of the active layer are doped in n or p type. The laser apparatus additionally includes a first cavity member overlaying the first emission layer, the first cavity member being characterized by a length of at least 100 um and a width of at least 0.5 um. The laser apparatus further includes a second cavity member overlaying the second the emission layer, the second cavity member being characterized by a length of at least 100 um and a width of at least 0.5 um.

In certain embodiments of the present invention, multiple laser peak wavelength is obtained by providing multiple active regions, and each of the active regions is associated with a specific wavelength. More specifically, multiple growth of active regions is performed across a single chip. In this technique a wafer is loaded in a growth chamber for the growth of an active region with one gain peak. After this growth, the wafer is subjected to one or more lithography and processing steps to remove a portion of the active region in some areas of the wafer. The wafer would then be subjected to a second growth where a second active region with a second peak gain wavelength is grown. Depending on the specific need, the processes of growing and removing active regions can be repeated many times. Eventually, be followed by the fabrication of laser diodes strategically positioned relative to these different active regions to enable lasing at various wavelengths.

Figure 2F:
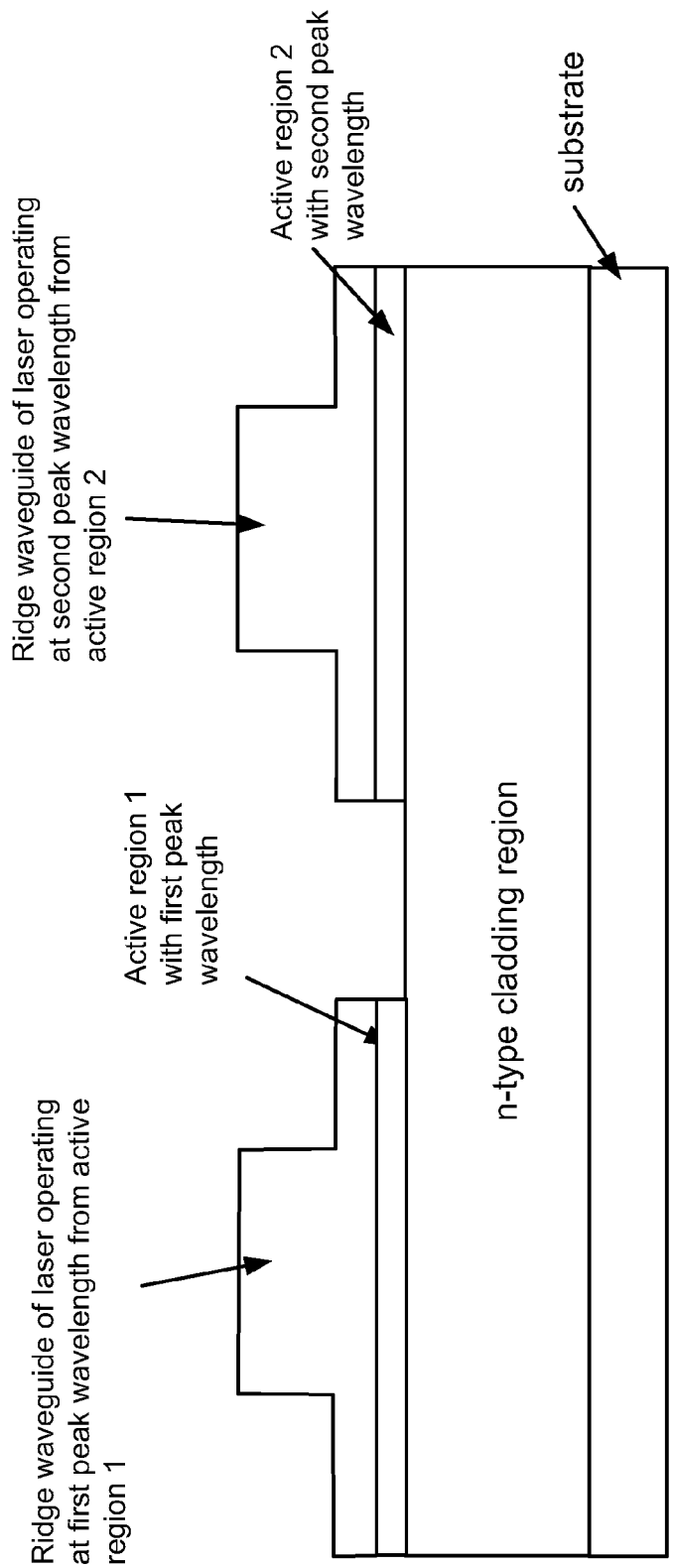
FIG. 2F is a diagram illustrating a laser device with multiple active regions.

FIG. 2F is a diagram illustrating a laser device with multiple active regions. According to an embodiment, the following steps are performed in a method for forming a device that includes laser devices having multiple active regions:
1. providing a gallium and nitrogen containing substrate including a first crystalline surface region orientation;
2. defining a first active region by performing a selective etching process;
3. forming a barrier layer within the first active region;
4. growing a first emission layer within the first active region, the first emission layer being characterized by a first gain peak wavelength;
5. defining a second active region by performing a selective etching process;
6. growing a second emission layer within the second active area, the second emission layer being characterized by a second gain peak wavelength, a difference between the first gain peak wavelength and the second gain peak wave length being at least 10 nm;
7. forming a first cavity member overlaying the first emission layer, the first cavity member being characterized by a length of at least 100 um and a width of at least 0.5 um; and
8. forming a second cavity member overlaying the second the emission layer, the second cavity member being characterized by a length of at least 100 um and a width of at least 0.5 um.

It is to be appreciated that the method described above can be implemented using various types of substrate. As explained above, the substrate member may have a surface region on the polar plane (c-plane), nonpolar plane (m-plane, a-plane), and semipolar plain ({11-22}, {10-1-1}, {20-21}, {30-31}, {20-21}, {30-31}). In the method described above, two active regions and two cavity members are formed. For example, each active region and cavity member pair is associated with a specific wavelength. Depending on the application, additional active regions and cavity members may be formed to obtain desired wavelengths and/or spectral width.

In a preferred embodiment, each of the active regions is characterized by a specific spatial dimension associated with a specific wavelength.

In a specific embodiment, a laser apparatus having multiple active regions and a broad spectrum is provided. The laser apparatus includes a gallium and nitrogen containing substrate including a first crystalline surface region orientation. For example, the substrate member may have a surface region on the polar plane (c-plane), nonpolar plane (m-plane, a-plane), and semipolar plain ({11-22}, {10-1-1}, {20-21}, {30-31}, {20-21}, {30-31}). The laser apparatus includes a first active region comprising a barrier layer and a first emission, the first emission layer being characterized by a first gain peak wavelength. The laser apparatus also includes a second active region comprising a second emission layer, the second emission layer being characterized by a second gain peak wavelength, a difference between the first gain peak wavelength and the second gain peak-wave length is 1 to 20 nm. In various embodiments, each of the active regions may include multiple active and barrier layers, as well as cladding layers. The laser apparatus also includes a first cavity member overlaying the first emission layer, the first cavity member being characterized by a length of at least 100 um and a width of at least 0.5 um. The laser apparatus includes a second cavity member overlaying the second the emission layer, the second cavity member being characterized by a length of at least 100 um and a width of at least 0.5 um.

In a specific embodiment, one or more layers of active regions are stacked on top of one another at different locations. More specifically, after initial growth of a first active region, one or more of the active regions could be selectively added or removed in different regions of the chip. As a result, multiple lasers with different wavelengths can be fabricated in locations that would result in different lasing wavelengths.

Figure 2G:
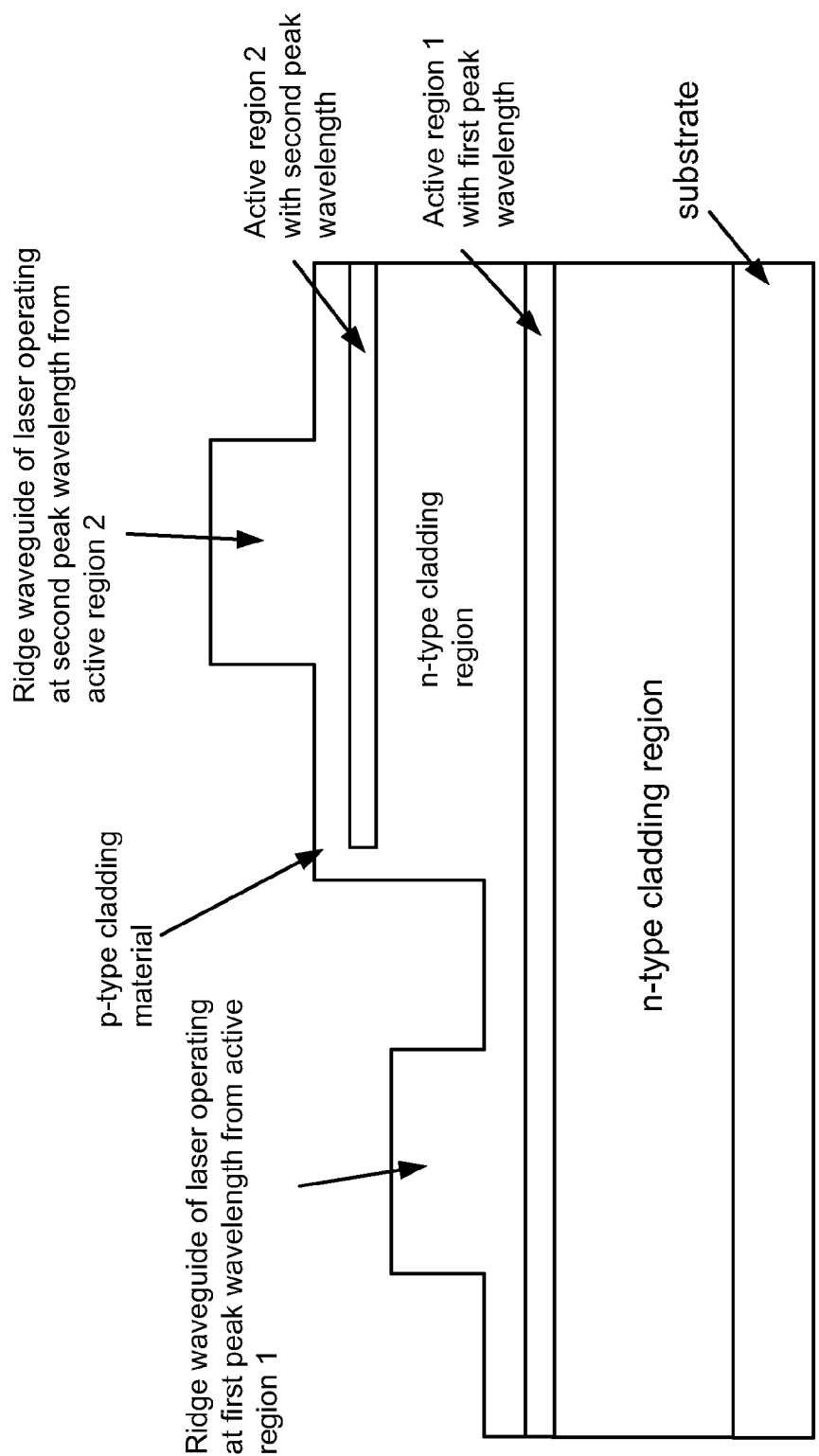
FIG. 2G is a diagram illustrating laser device with layered light emission layers; according to an embodiment of the present invention.

FIG. 2G is a diagram illustrating laser device with layered light emission layers according to an embodiment of the present invention. It is to be appreciated embodiments of the present invention provides method for obtaining multiple laser wavelengths after the active regions have already been formed. More specifically, the gain-peak of the semiconductor material can be spatially manipulated post-growth through quantum well intermixing (QWI) processes and/or disordering of the light emitting layers. A QWI process makes use of the metastable nature of the compositional gradient found at heterointerfaces. The natural tendency for materials to interdiffuse is the basis for the intermixing process. Since the lower energy light emitting quantum well layers are surrounded by higher energy barriers of a different material composition, the interdiffusion of the well-barrier constituent atoms will result in higher energy light emitting layers and therefore a blue-shifted (or shorter) gain peak.

The rate at which this process takes place can be enhanced with the introduction of a catalyst. Using a lithographically definable catalyst patterning process, the QWI process can be made selective. This is the process by which virtually all selective QWI is performed, whether it is by the introduction of impurities or by the creation of vacancies. By using these techniques There are a great number of techniques that have evolved over the years to accomplish selective intermixing, such as impurity-induced disordering (IID), impurity-free vacancy-enhanced disordering (IFVD), photoabsorption-induced disordering (PAID), and implantation-enhanced interdiffusion to name just a few. Such methods are capable of shifting the peak gain wavelengths by 1 to over 100 nm. By employing one of these mentioned or any other QWI method to detune the gain peak of adjacent laser devices, the convolved lasing spectrum of the side by side devices can be altered.

Broad laser spectrum can also be achieved by way of current/voltage control, as described in certain embodiments of the present invention. More specifically, two or more lasers are positioned side by side and make use of separate p-electrodes such that the injected current into each laser could be independently controlled. For example, it is known that band-filling, self-heating, and carrier induced refractive index changes alter the lasing wavelength as a function of applied current and voltage. Therefore, by having independent current/voltage control of two or more adjacent lasers, the wavelengths can be detuned from each other by 1 to 10 nm.

Figure 3:
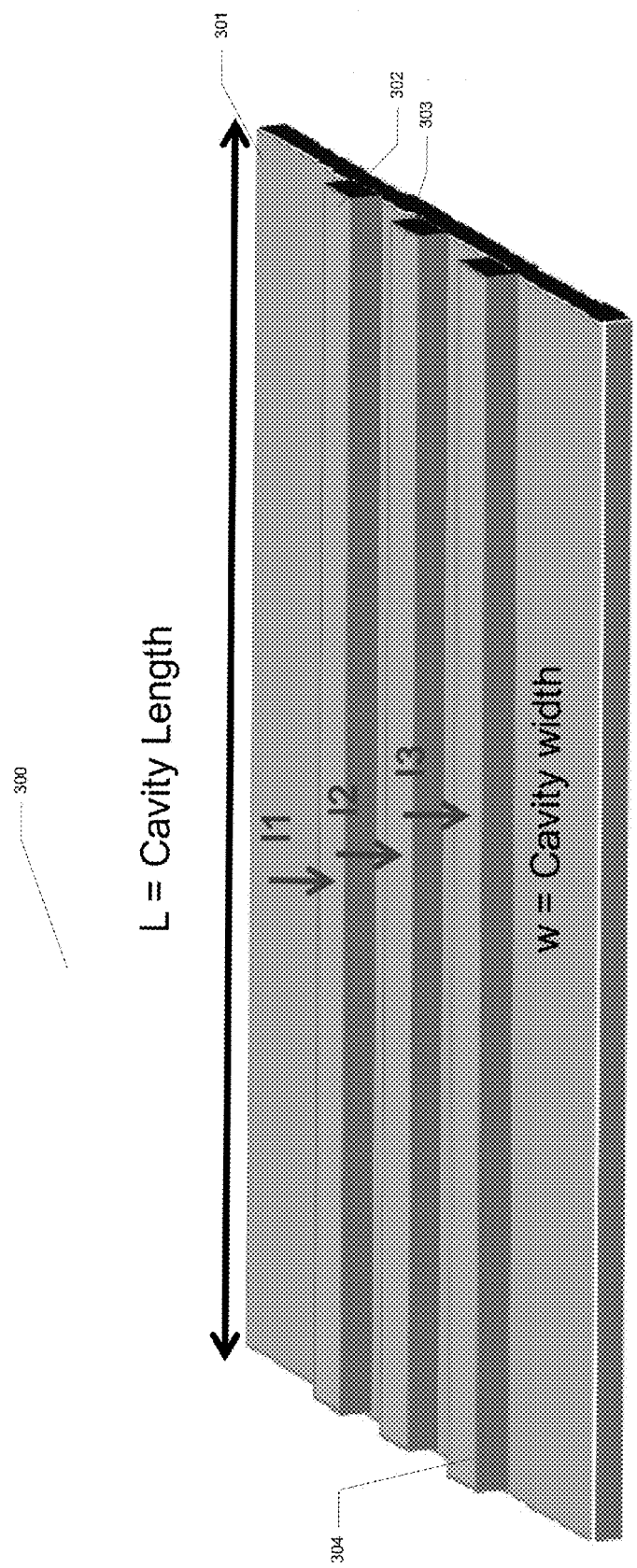
FIG. 3 is a diagram illustrating applying different currents applied to adjacent laser diodes according to an embodiment of the present invention.

FIG. 3 is a diagram illustrating applying different currents applied to adjacent laser diodes according to an embodiment of the present invention. As shown in FIG. 3, a laser apparatus 300 includes a substrate 301. For example, the substrate member may have a surface region on the polar c-plane (0001), nonpolar planes such as the m-plane (10-10) or a-plane (11-20), and semipolar planes such as ({11-22}, {10-1-1}, {20-21}, {30-31}, {20-21}, {30-31}). Cavities member 302, 303, and 304 are on the substrate 301. As explained above, the cavities members are configured to function as waveguide for emitting laser. For example, each of the cavity members is associated with a laser. Each of the adjacent lasers is electrically coupled to a current and/or a voltage source. For example, FIG. 3 illustrates that the laser with cavity member 302 is coupled to current I1, the laser with cavity member 303 is coupled to current I2, and the laser with cavity member 304 is coupled to current I3. By adjusting the current and/or voltage sources connected to each of the lasers, the wavelength of adjacent layers. For example, by adjusting the current provided to the lasers, the laser wavelength can be detuned from each other by 1 to 10 nm, thereby allowing for a broad spectrum. For example, the adjacent lasers as shown in FIG. 3 are configured to emit laser light at wavelength of about 523 nm, 525 nm, and 527 nm, as illustrated in FIG. 2B.

In certain embodiments, two or more lasers are positioned side by side and make use of a common p-electrode such that the injected current into each laser is dictated by the current divider rule resulting from the resistance differential of the two or more diodes. The side-by-side lasers can be designed to have different resistances by changing the current injection area. An example is to position two side-by-side laser cavities where the first laser cavity has a width of 2 um and the second cavity has a width of 4 um. Due to the wider area of the second laser, the resistance is lower and therefore more current are injected into the second laser. The difference in the amount of current injected creates a difference in the junction temperature (and/or in carrier density), resulting in a different peak lasing wavelengths between different lasers. For example, by having different resistances, differences in lasing wavelengths on the order of 1-5 nm are achieved.

Figure 4:
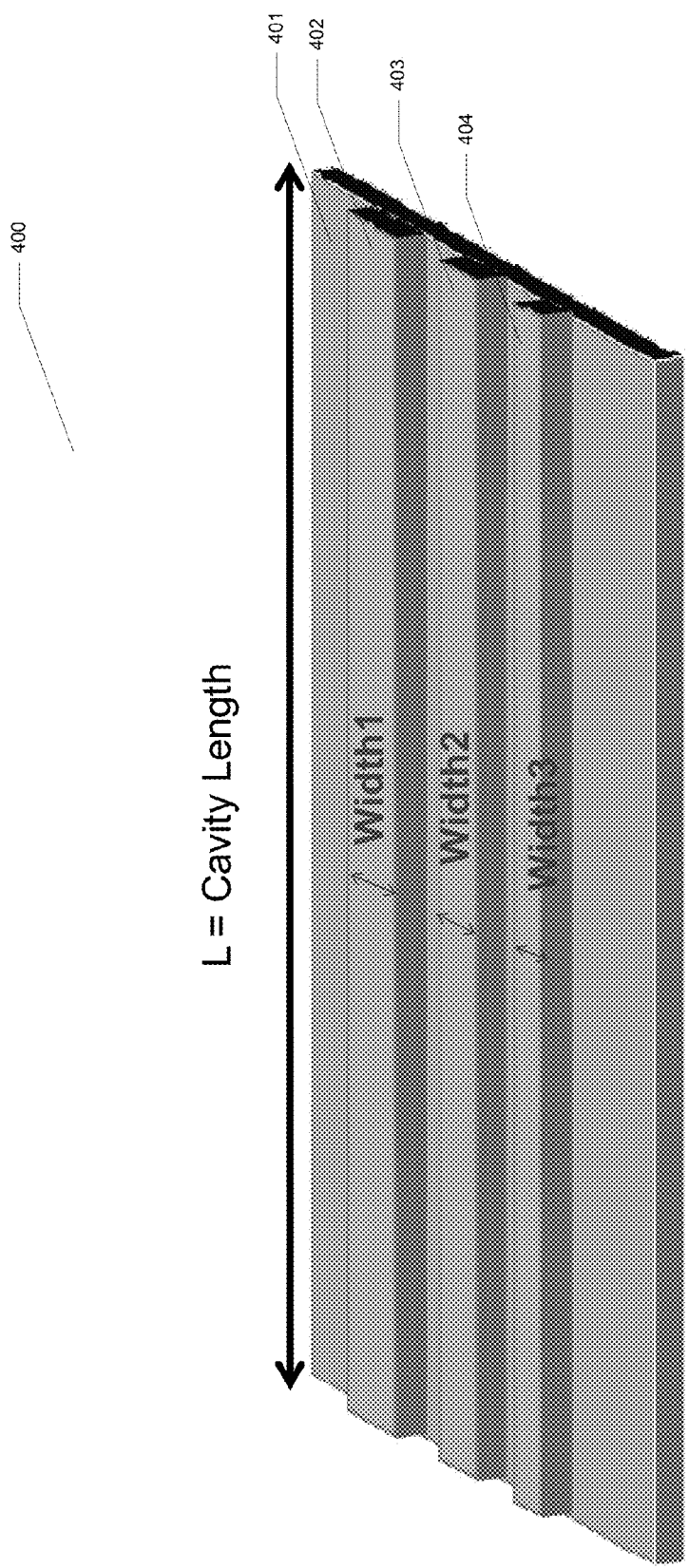
FIG. 4 is diagram illustrating laser diodes having different ridge widths arranged together.

Broad laser spectrum can also be achieved by having two or more lasers operating in different lateral mode orders positioned side-by-side. FIG. 4 is simplified diagram illustrating laser diodes having different ridge widths arranged together according to an embodiment of the present invention. This diagram is merely an example, which should not unduly limit the scope of the claims. One of ordinary skill in the art would recognize many variations, alternatives, and modifications. As shown in FIG. 4, a laser apparatus 400 includes laser diodes having cavity members 402, 403, and 404 sharing a substrate 401. For example, the substrate member may have a surface region on the polar plane (c-plane), nonpolar plane (m-plane, a-plane), and semipolar plain ({11-22}, {10-1-1}, {20-21}, {30-31}, {20-2-1}, {30-3-1}). The cavity members function as waveguides for laser diodes. For example, as cavity widths are increased, the number of permitted higher order lateral modes of the laser diode is increased. Since the various lateral modes have differing overlap relationships with gain layers and the lossy p-cladding layers, the modal gain versus loss relationship will vary and the peak wavelengths can vary by as much as 2 nm to 8 nm.

In an exemplary embodiment, geometry for cavity members would be to position a first laser with 2 um (e.g., width 3) wide cavity member next to a second laser with a 4 um (e.g., width 2) wide cavity next to a third laser with a 6 um (e.g., width 3) wide cavity. As an example, all three lasers can be covered by a common or separate p-electrodes and the electrode(s) would be biased such that all lasers were beyond threshold. Since all lasers would operate with different peak wavelengths, a multi-peaked spectrum is achieved.

In certain embodiments, broad laser spectrum is obtained by having a single emitter operating at different peak wavelengths. More specifically, laser diodes are formed on nonpolar and semipolar Ga-containing substrates that operate with two or more spectral lasing peaks. Depending on the application, the two or more spectral peaks are produced in the same laser cavity and are excited simultaneously or sequentially. It is to be appreciated that embodiments of the present invention provides several ways to achieve multiple laser wavelengths.

An abrupt shift in the lasing wavelength is often referred to as a mode hope. Mode hops can occur for several reasons such as an instantaneous shift of the lasing mode from one longitudinal cavity mode to another, from one lateral mode to another, or excitation of additional lateral mode. Such hops can be induced by modulation of current, temperature, or optical feedback into the cavity. Here we want to claim any one of these methods as means to alter the spectrum in a favorable way for applications such as speckle reduction in displays The multiple peak wavelength is obtained by applying an intentional RF-modulation on the gain region to induce mode hopping. More specifically, a laser device includes a gallium and nitrogen containing substrate including a first crystalline surface region orientation. For example, the substrate member may have a surface region on the polar plane (c-plane), nonpolar plane (m-plane, a-plane), and semipolar planes ({11-22}, {10-1-1}, {20-21}, (30-31), {20-21}, {30-31}). The laser device includes an active region comprising at least one quantum well or double hetereostructure and a barrier layer. The laser device may additionally include one or more barrier layers, active layers, and/or cladding layers. The laser device includes a cavity member overlaying the active region, the cavity member being characterized by a length along a c-plane, the length being at least 100 um, the cavity having a width of at least 0.5 um, the cavity member being configured to emit laser characterized by a spectral width of at least 1 nm. For example, the cavity member functions as waveguides for laser diodes.

The laser device also includes an RF source electrically coupled to the active region through an electrode for providing RF modulation, the RF modulation being configured to induce mode hopping or spectral broadening. The RF signal may be applied to a singular electrode coupled to the p-type or n-type Ga-containing material for current injection into the laser diode in addition to the direct current (DC) or alternating current (AC) required to operate the laser in its given application. Alternatively, the device can be configured to have 2 or more electrodes coupled to the p-type or n-type Ga-containing material such that the RF signal can be applied to the laser through a separate electrode than the primary direct current (DC) or alternating current (AC) required to operate the laser in its given application.

Figure 6:
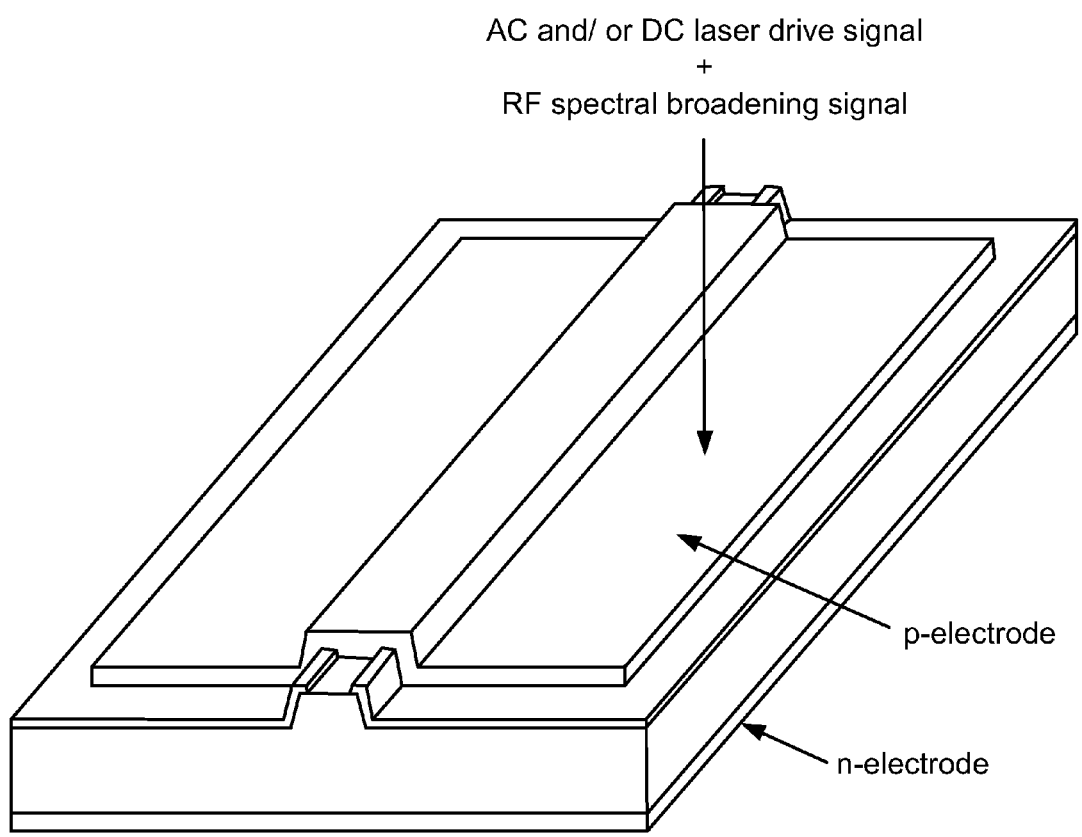
FIG. 6 is a diagram illustrating a laser device for receiving RF signals.

FIG. 6 is a diagram illustrating a laser device configured for receiving RF signals. As shown in FIG. 6, both AC and/or DC laser drive signals and RF spectral broadening signal are electrically coupled to the p-electrode. Depending on the application, RF signals can be coupled to a laser device using an electrode that is separate from the electrode that is coupled to the AC and/or DC laser drive signal.

Figure 7:
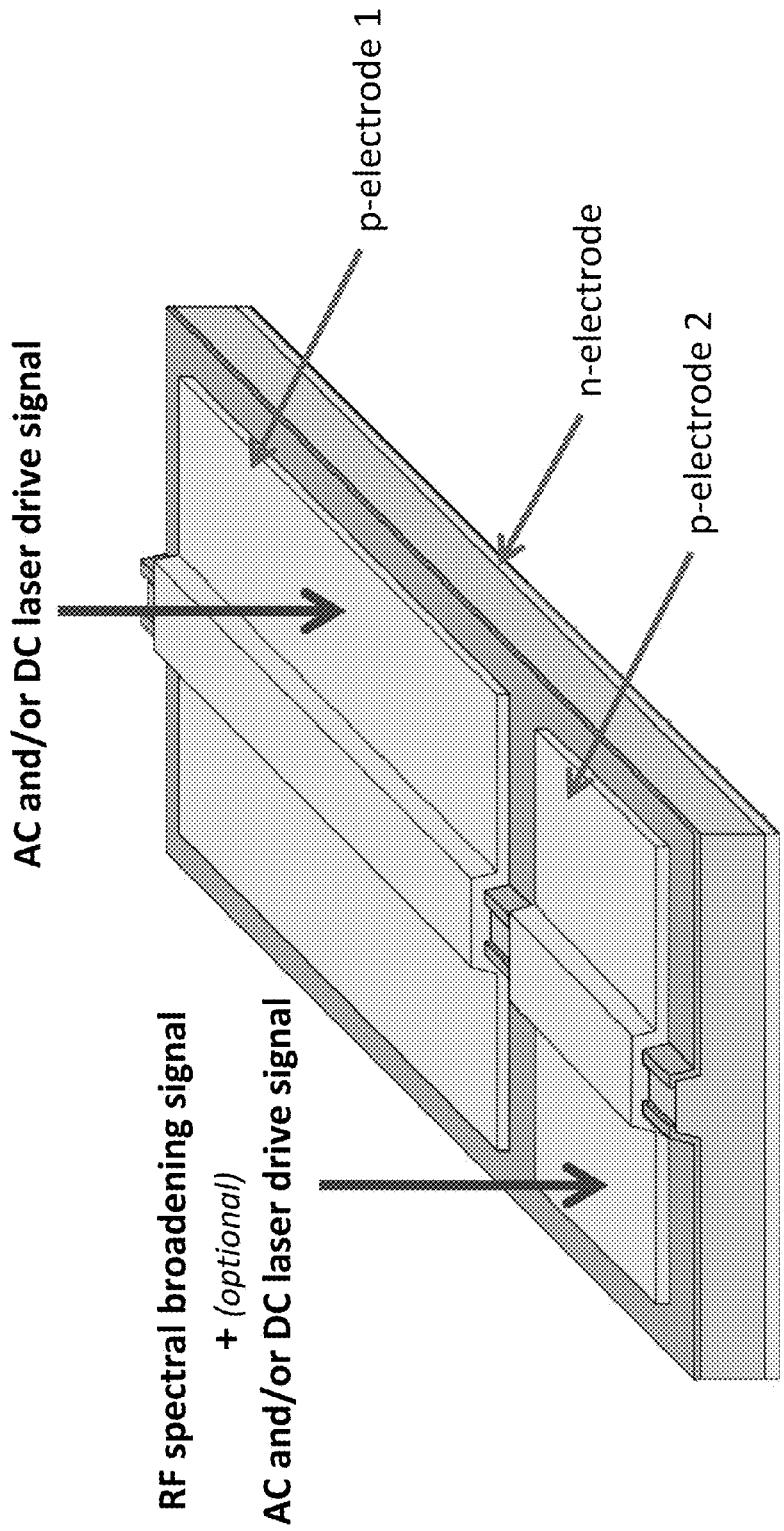
FIG. 7 is a diagram illustrating a laser device having multiple electrodes configured for receiving RF signals.

FIG. 7 is a diagram illustrating a laser device having multiple electrodes configured for receiving RF signals. AC and/or DC laser drive signals are coupled to the p-electrode 1 and the RF signals are coupled to the p-electrode 2. P-electrode 1 and p-electrode 2 as shown are separated from each other.

Figure 8:
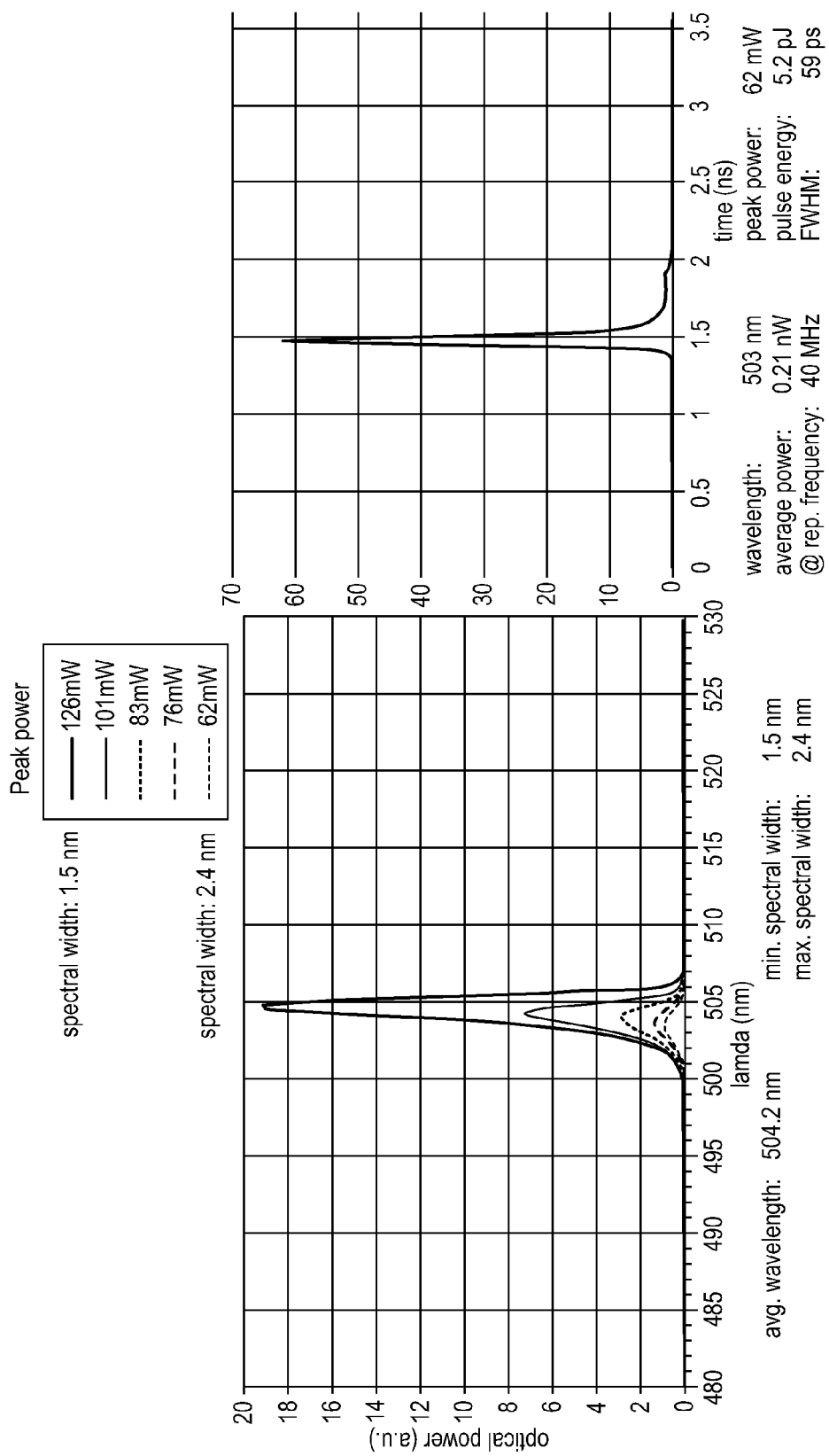
FIG. 8 is a diagram illustrating spectral broadening effect caused by RF modulation.

The RF signals, when received by the laser device, cause a shift in wavelength. The RF signals can widen the spectral width of laser output. FIG. 8 is a simplified diagram illustrating spectral broadening effect caused by RF modulation. For example, the wavelength shifts from 508 nm CW to about 503-505 nm pulsed. The spectral width can be broadened from 1 nm CW to 2.4 nm FWHM as a result of 59 psec 40 MHz operation with peak power 62 mW. For example, in gain switching (without DC bias), each pulse grows from spontaneous emission. Since the pulses are very short, the spectral transients during the first few hundred ps become visible in the average spectrum. With mode competition not yet finished on this time frame, modes with non-maximum net gain still have significant power and become visible in the average spectrum. In contrast, for CW operation, the mode with the highest net gain dominates the spectrum, due to mode competition.

During gain switching, the carrier density significantly changes during emission of the leading pulse peak. This leads to a spectral shift of the gain spectrum, favoring different spectral modes. This further increases the number of modes visible in the average spectrum. Additionally, each individual mode broadens due to chirp, as the refractive index changes with the carrier density.

It is to be appreciated that by increasing the spectral width (e.g., by providing RF signals), speckling effect can be reduced, as explained above. For example, speckle typically refers to random intensity pattern produced by the mutual interference of a set of wave fronts. This phenomenon has been investigated by scientists since the time of Newton, but speckles have come into prominence since the invention of the laser and have now found a variety of applications. Due to the longer coherence lengths of laser sources compared to bulbs or LEDs, speckle is considered to be a problem in laser based display systems like the Laser TV.

As an example, speckle effects are defined by Goodman's *Speckle Phenomena in Optics*, where Contrast=C Finite bandwidth source with wavelength 1 and spectral width d1

Rough surface for normal incidence and observation with σh=the surface height standard deviation $$C|\sigma_h, \delta\lambda, \lambda| := \sqrt{\frac{1}{1 + 8\pi^2 \left(\frac{\delta\lambda}{\lambda}\right)^2 \left(\frac{\sigma_h}{\lambda}\right)^2}} \quad \text{Equation (5.110)}$$

Conventional displays/projectors that use laser diode as light source typically use second-harmonic generation (SHG) technique to produce green laser light, which is both inefficient and prone to speckles. FIG. 9 is a simplified diagram illustrating speckle reduction by using RF modulation. As shown in FIG. 9, laser light produced by the SHG technique typically have a small spectral width of about 0.1 nm, and as a result the speckle contrast is between about 0.7 to 1 at various surfaces. In contrast, wider spectral width of 1 nm and/2 nm, the amount of speckle contrast is laser is reduced to below 0.3 at 500 um surface height.

Depending on the application, RF signals can be coupled to laser diodes in various ways to increase spectral width and reduce speckle. For example, by modulating laser diodes, the RF signals can induce gain switching and hence mode competition such that more cavity modes are excited on average which widens the spectral width. Further, carrier modulation effects the index in which shifts the gain peak and hence modulates the spectrum, and over time period, the spectrum is widened.

In another embodiment, multiple peak wavelength is obtained by applying an external optical feedback signal into the cavity to induce mode hopping or spectral broadening. More specifically, a laser device includes a gallium and nitrogen containing substrate including a first crystalline surface region orientation. For example, the substrate member may have a surface region on the polar plane (c-plane), non-polar plane (m-plane, a-plane), and semipolar plain ({11-22}, {10-1-1}, {20-21}, {30-31}, {20-21}, {30-31}). The laser device includes an active region comprising at least a quantum well or double hetereostructure emitting layer and a barrier layer. The laser device may additionally include one or more barrier layers, active layers, and/or cladding layers. The laser device includes a cavity member overlaying the active region, the cavity member being characterized by a length along a c-plane, the length being at least 100 um, the cavity having a width of at least 0.5 um, the cavity member being configured to emit laser characterized by a spectral width of at least 1 nm. For example, the cavity member functions as waveguides for laser diodes. The laser device additionally includes an optical feedback signal source coupled to the active region for inducing mode hopping.

In another embodiment, multiple peak wavelength is obtained by utilizing light generated in the laser diode in question or an adjacent light emitting device to provide optical feedback and induce mode hopping. It is to be appreciated that there are other ways to induce multiple peak wavelengths as well.

Figure 5:
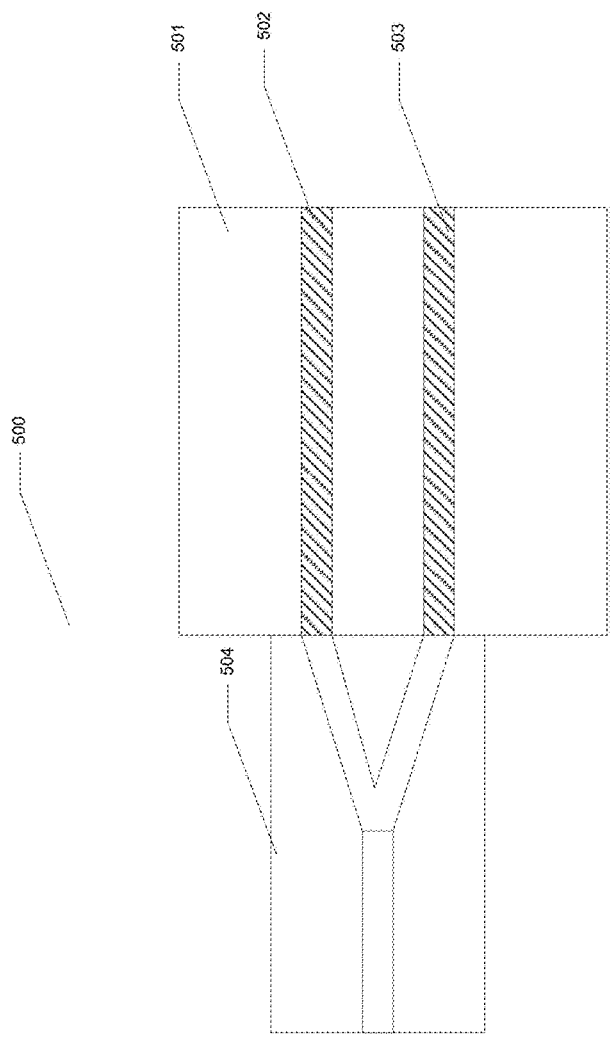
FIG. 5 is a diagram illustrating an optical system having a wave guide.

In certain embodiments, optical members are provided for combining laser beams emitted for two or more laser diodes. FIG. 5 is a diagram illustrating an optical system having a wave guide according to an embodiment of the present invention. This diagram is merely an example, which should not unduly limit the scope of the claims. One of ordinary skill in the art would recognize many variations, alternatives, and modifications. As shown in FIG. 5, an optical system 500 is configured to provided directional light (e.g., laser beams) with a broad spectral width. The optical system 500 includes a substrate 501. Depending on the application, the substrate 501 includes one or more layers of light emitting regions and/or barrier regions. Cavity members 502 and 503 are provided on top of the substrate 501. For example, laser beams of different wavelengths are emitted from the cavity members 502 and 503. A waveguide 504 is configured to combine the output from cavities member 502 and 503. The output light from the waveguide 504 is a combination of light of different wavelengths. As a result, the spectral width of the output from the waveguide can be up to 10 nm. It is to be appreciated that depending the specific implementation, other variations are possible. For example, other optical elements (e.g., prisms, diachromatic lenses, etc.) and designs can be used to combine two or more laser beam lights.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical device comprising:
    a gallium and nitrogen containing substrate including a first crystalline surface region which has semi-polar or non-polar orientation;
    an active region including at least one quantum well, each of the quantum wells having a thickness of at least 1.5 nm and at least one barrier layers, each of the barrier layers having a thickness between about 2 nm and about 22 nm, and
    a cavity member overlaying the active region, the cavity member having a length of at least 100 um, a width of at least 0.5 um, a first end having an reflectivity of at least 85%, a second end having a reflectivity of 1% or less, the cavity member being configured to emit a directional beam of light having a spectral width of at least 3 nm, the cavity member being configured to emit radiation at a wavelength between about 430 nm to 540 nm, the spectral width being adapted to reduce speckle associated with the directional beam.

2. The device of claim 1 wherein spectral width is at about 4 nm to 8 nm.

3. The device of claim 1 wherein the first crystalline surface region orientation comprises a semipolar plane such as {20-21}, {30-31}, {20-2-1}, {30-3-1}, or {11-22}.

4. The device of claim 1 wherein the second end is characterized by a reflectivity of less than about 0.2%.

5. The device of claim 1, wherein the first crystalline surface region has a nonpolar orientation.

6. The device of claim 5, wherein the first crystalline surface region has an in-plane orientation.

7. The device of claim 1, wherein the spectral width is from 1 nm to 10 nm.

8. The device of claim 1 wherein the spectral width is from 1 nm to 20 nm.

9. The device of claim 1, wherein the device is configured to operate as a superluminescent diode.

10. The device of claim 1, wherein the cavity member is configured to emit radiation at a wavelength between about 430 nm to about 465 nm.

11. The device of claim I, wherein the cavity member is configured to emit radiation at a wavelength between about 500 nm to 540 nm.

12. The device of claim 1, wherein the device is operable as a light source in a display system.

13. The device of claim 1, wherein the first end has a reflectivity of at least 90%.

* * * * *